US012596142B2

(12) United States Patent
Newman et al.

(10) Patent No.: US 12,596,142 B2
(45) Date of Patent: Apr. 7, 2026

(54) SYSTEMS AND METHODS FOR DETECTING AND CLASSIFYING DRONE SIGNALS

(71) Applicant: DeepSig Inc., Arlington, VA (US)

(72) Inventors: Timothy Newman, Edgewater, MD (US); Matthew Pennybacker, Laurel, MD (US); Michael Piscopo, King of Prussia, PA (US); Nathan West, Washington, DC (US); Tamoghna Roy, Arlington, VA (US); Timothy James O'Shea, Arlington, VA (US); James Shea, Arlington, VA (US)

(73) Assignee: DeepSig Inc., Arlington, VA (US)

( * ) Notice: Subject to any disclaimer, the term of this patent is extended or adjusted under 35 U.S.C. 154(b) by 861 days.

(21) Appl. No.: 17/401,043

(22) Filed: Aug. 12, 2021

(65) Prior Publication Data

US 2022/0050133 A1     Feb. 17, 2022

Related U.S. Application Data

(60) Provisional application No. 63/064,497, filed on Aug. 12, 2020.

(51) Int. Cl.
G01R 29/08 (2006.01)
B64U 10/14 (2023.01)
(Continued)

(52) U.S. Cl.
CPC ........... G01R 29/0892 (2013.01); G06N 3/08 (2013.01); B64U 10/14 (2023.01); B64U 2201/20 (2023.01); G07C 5/008 (2013.01)

(58) Field of Classification Search
CPC .................................................. G01R 29/0892
See application file for complete search history.

(56) References Cited

U.S. PATENT DOCUMENTS 10,305,766 B1 *  5/2019  Zhang ..................... G06N 3/044
2018/0137406 A1  5/2018  Howard et al.
(Continued)

FOREIGN PATENT DOCUMENTS

WO     WO 2019161076        8/2019
WO     WO-2019161076 A1 *  8/2019   ............. G01R 29/08

OTHER PUBLICATIONS

International Preliminary Report on Patentability in International Appln. No. PCT/US2021/045758, dated Feb. 23, 2023, 8 pages.
(Continued)

*Primary Examiner* — Imran K Mustafa
(74) *Attorney, Agent, or Firm* — Fish & Richardson P.C.

(57) ABSTRACT

Methods, systems, and apparatus, including computer programs encoded on computer-storage media, for detecting and classifying radio signals. The method includes obtaining one or more radio frequency (RF) snapshots corresponding to a first set of signals from a first RF source; generating a first training data set based on the one or more RF snapshots; annotating the first training data set to generate an annotated first training data set; generating a trained detection and classification model based on the annotated first training data set; and providing the trained detection and classification model to a sensor engine to detect and classify one or more new signals using the trained detection and classification model.

20 Claims, 9 Drawing Sheets

(51) Int. Cl.
    *G06N 3/08*       (2023.01)
    *G07C 5/00*       (2006.01)

(56)                References Cited

U.S. PATENT DOCUMENTS

2018/0308013 A1 *  10/2018  O'Shea  .................. G06N 20/00
2020/0191913 A1 *   6/2020  Zhang  .................... G01S 7/412

OTHER PUBLICATIONS

International Search Report and Written Opinion in International Appln. No. PCT/US2021/045758, dated Nov. 15, 2021, 9 pages.

* cited by examiner

500

OBTAIN DATA CORRESPONDING TO A TRAINED
DETECTION AND CLASSIFICATION MODEL    <u>502</u>

GENERATE A TRAINED MODEL BASED ON THE DATA
CORRESPONDING TO THE TRAINED DETECTION AND
CLASSIFICATION MODEL    <u>504</u>

DETECT AND CLASSIFYING ONE OR MORE NEW
SIGNALS BASED ON THE TRAINED MODEL    <u>506</u>

SYSTEMS AND METHODS FOR DETECTING AND CLASSIFYING DRONE SIGNALS

CROSS REFERENCE TO RELATED APPLICATIONS

This application claims the benefit of U.S. Provisional Application No. 63/064,497, filed Aug. 12, 2020, the contents of which are incorporated herein by reference.

FIELD

This specification generally relates to drones and corresponding communication signals.

BACKGROUND

Unmanned aircraft systems, such as drones, can be controlled and can send data, e.g., audio data, video data, telemetry, packets, among others, over wireless connections. The types of radio frequency (RF) communication protocols used by the drones in the wireless connections can vary. Some drones use proprietary protocols while others use open source protocols. In some cases, consumer drones may use standard protocols such as IEEE 802.11, Wi-Fi, WiMAX, LTE, or other suitable protocols, as the technology for transmitted data. In recent years, some drone manufacturers have been developing proprietary transmission systems that can provide better interference mitigation and longer ranges. With the addition of such custom transmission systems, the ecosystem for drone wireless communication protocols has become much more diverse.

SUMMARY

In general, the subject matter described in this disclosure can be embodied in methods, apparatuses, and systems for training and deploying machine-learning networks to detect and classify (for example, identify signal types) a variety of RF communications signals (also referred to as radio signals) from drones or other unmanned aircraft systems (UASs), other unmanned vehicles, or other wireless devices such as Internet of Things (IoT) devices. In some implementations, the communications signals include digital communications signals. In some implementations, the systems and methods include a software development kit (SDK), or a studio or model development kit (MDK), that is used to generate a custom neural network model, which is then deployed in a sensor or other signal processing system to perform signal identification on wireless signals emitted from UASs, such as drones, or other unmanned systems or wireless devices. The SDK or MDK application will go through an end-to-end process of obtaining signal data to create a dataset, labeling and annotating the data in the dataset, training the neural network model using this dataset, and finally deploying the neural network model in a sensor or other signal processing system for signal identification. In the following sections, the techniques disclosed herein are described with reference to an SDK for ease of description. However, the techniques are equally applicable to MDKs.

In some implementations, the SDK may enable users to create their own network models using their own datasets to enable the sensor to detect and classify any particular signals of interest to the users. The SDK may include tools for a number of operations including: sorting, detection, labeling, segmenting, clustering, or curating RF data; training a sensor model (for example, a neural network model for use as a sensor, or deployed in existing sensor hardware) with labeled data; evaluating the sensor model's performance; and deploying the trained sensor model.

The tool suite of the SDK may enable customers to tune learning models, such as deep learning models, for signal detection and classification (also referred to as identification or recognition) for specific RF emissions or signatures and applications of interest to the customers. In some implementations, the SDK enables signal processing on complex-valued RF sample data (e.g., sampled radio data), or transforms of RF sample data, such as Fourier transforms of the data, averages or other preprocessed forms of the RF sample data. For example, the SDK may include specialized features to assist in working with large RF datasets.

One innovative aspect of the subject matter described in this specification is embodied in a method that includes obtaining one or more radio frequency (RF) snapshots corresponding to a first set of signals from a first RF source; generating a first training data set based on the one or more RF snapshots; annotating the first training data set to generate an annotated first training data set; generating a trained detection and classification model based on the annotated first training data set; and providing the trained detection and classification model to a sensor engine to detect and classify one or more new signals using the trained detection and classification model.

Other implementations of this and other aspects include corresponding systems, apparatus, and computer programs, configured to perform the actions of the methods, encoded on computer storage devices. A system of one or more computers can be so configured by virtue of software, firmware, hardware, or a combination of them installed on the system that in operation cause the system to perform the actions. One or more computer programs can be so configured by virtue of having instructions that, when executed by data processing apparatus, cause the apparatus to perform the actions.

The foregoing and other embodiments can each optionally include one or more of the following features, alone or in combination. For instance, in some implementations, the first RF source is included in an unmanned aerial system (UAS). In some aspects, obtaining the one or more RF snapshots based on the first set of signals from the first RF source includes enabling manual or fixed channel configuration on the first RF source.

In some implementations, the first set of signals include one or more signals based on an Ocusync protocol, variants of a Wi-Fi protocol, or a Frequency Shift Keying (FSK) emitter.

In some implementations, actions include controlling, through one or more graphical user interfaces corresponding to one or more computers, one or more of: generating the first training data set, generating the annotated first training data set, or generating the trained detection and classification model.

In some implementations, a graphical user interface of the one or more graphical user interfaces provides a visualization of a performance metric corresponding to generating the trained detection and classification model based on the annotated first training data set. In some aspects, the performance metric includes a loss curve.

In some implementations, annotating the first training data set to generate the annotated first training data set is performed automatically by an auto-annotation process.

In some implementations, actions include verifying that the trained detection and classification model is operating correctly using one or more verification graphical user interfaces corresponding to one or more computers where a verification graphical user interface of the one or more verification graphical user interface displays one or more graphical representations of signals with respective classifications generated by the trained detection and classification model.

In some implementations, the one or more computers act as a front-end RF survey component within a system.

In some implementations, the one or more new signals share one or more common RF characteristics with the first set of signals.

In some implementations, the first training data set includes data corresponding to the first set of signals from the first RF source and a predetermined training data set based on one or more other RF sources.

In some implementations, one or more computers performing actions described are communicably connected to one or more RF antennas configured to detect the first set of signals from the first RF source.

In some implementations, detecting and classifying the one or more new signals using the trained detection and classification model includes obtaining data of the one or more new signals in an environment using one or more RF antennas connected to the sensor engine; providing the data of the one or more new signals as input to the trained detection and classification model; and obtaining an output indicating one or more of a signal classification of the one or more new signals, or a confidence value corresponding to the signal classification.

In some implementations, the confidence value indicates a likelihood that the signal classification determined by the trained detection and classification model accurately determines signal types of the one or more new signals.

Implementations of the above techniques include methods, apparatus, and computer program products. One such computer program product is suitably embodied in one or more non-transitory machine-readable media storing instructions that, when executed by one or more processors, are configured to cause the one or more processors to perform the above-described actions. One such apparatus includes processing circuitry to execute instructions to perform the above-described actions. The instructions may be stored in memory coupled to the apparatus. In some implementations, the apparatus is a sensor or other signal processing device that detects RF signals and identifies one or more characteristics of the detected signals.

Through use of custom machine learning techniques, the systems and methods disclosed herein go beyond the capabilities of existing RF signal spectrum monitoring technologies. Systems and methods may leverage convolutional neural networks, or variations thereof, such as residual networks, depth wise convolutional networks, U-Nets, or other suitable combinations of similar such layers, in addition to several custom RF-tailored network architectures that use complex baseband in-phase and quadrature (IQ) data, including one or more of time and frequency domains, to maximize features of RF signals learned by a system.

Compared to traditional methods, the disclosed methods and systems can provide higher sensitivity and be more robust in harsh and dynamic communication environments. Furthermore, the methods and systems may use less dynamic range and computational resources, better match a set of impairments, such as hardware distortion, interference, propagation, among others, and/or require less engineering time to train and deploy one such system. For drone detection applications, the methods and systems can detect a wide range of drone signal types with increased sensitivity, which allows a RF signal detection sensor to detect signals further from a signal source. The systems and methods can also be applied to other types of RF signal emitters, such as unmanned terrestrial or aquatic vehicles, manned vehicles, or IoT or other radio devices. The sensor component may be integrated onto a variety of hardware platforms, both embedded devices, such as a small handheld, mounted, or flown devices and large platforms, such as vehicles, drones, airplanes, towers, poles, tripods, ships or buildings. The hardware platforms can include external systems developed by third party vendors. For instance, third party radios or antennas, or network bus architectures, can be used to enable the deployment of such a system.

In some cases, the methods and systems may provide a standard output developed with an open application programming interface (API) or standard data format such as JSON, XML, or Signal Metadata format (SIGMF). For example, by including standardized output developed with an open API, the methods and systems may generate output that may be processed by other systems or processes with minimal or no additional intermediate processing. In some cases, the outputs include detection or event data records, which may be fused with other sensor data to enrich or combine information about detection or other events of interest to a user, and may be presented to the user in a high level and interpretable way, for example describing the underlying generating phenomena or emitter and its presence, location, or history.

The details of one or more embodiments of the invention are set forth in the accompanying drawings and the description below. Other features and advantages of the invention will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
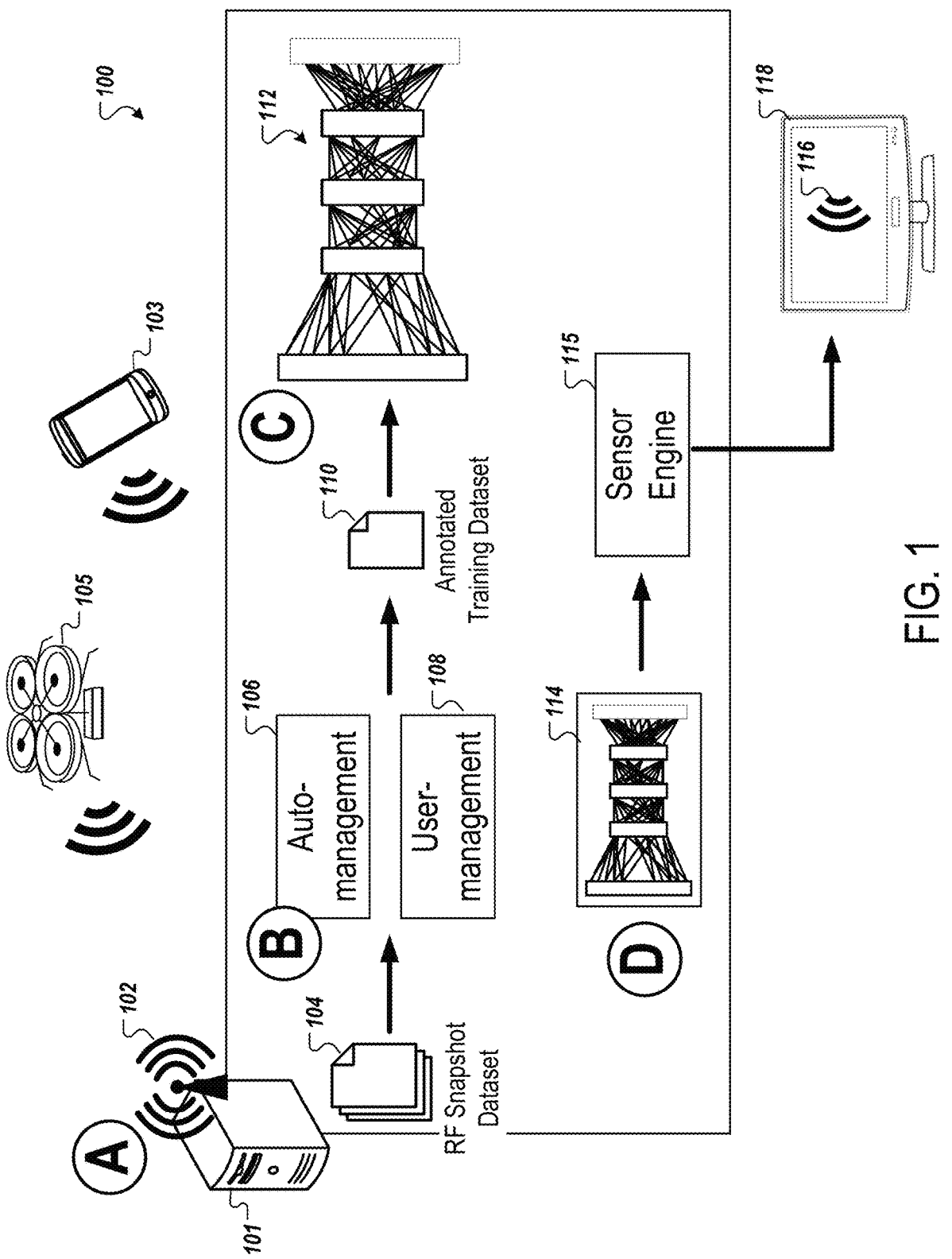
FIG. 1 is a diagram showing an example of a system for detecting radio signals emitted by drones.

FIG. 1 is a diagram showing an example of a system 100 for detecting radio signals emitted by drones or other radio emitters. The system 100 includes control unit 101, a sensor 102 and a drone 105 controlled by a drone controller 103. The control unit 101 is communicatively connected to the sensor 102. In the following sections, the system 100 and the disclosed techniques are described with respect to radio signals from the drone 105. However, the system 100 and the disclosed techniques are also applicable to radio signals from other types of UASs, unmanned aerial vehicles (UAVs), unmanned vehicles (e.g., terrestrial unmanned vehicles, or aquatic unmanned vehicles, among others), manned vehicles (e.g., terrestrial manned vehicles, or aquatic manned vehicles, among others), IoT devices, cellular devices, or wireless devices. That is, other types of UASs, UAVs, unmanned vehicles, manned vehicles, IoT devices, cellular devices, or wireless devices may be used in place of, or in addition to, the drones discussed herein.

The sensor 102 is configured to receive one or more wireless communication signals. The sensor 102 may detect, for example, RF signals from data output devices of the drone 105. The sensor 102 may also detect RF signals from the drone controller 103. The controller 103 may be a computing device, configured with one or more radio antennas for transmitting and receiving RF control signals to and from the drone 105 (e.g., the controller 103 may transmit uplink command and control signals to the drone 105 and receive downlink data signals from the drone 105). The command and control signals may be configured for the drone 105 to receive and perform one or more operations in response to receiving these signals. The data output devices of the drone 105, such as RF radio antennas and associated circuitry, may generate RF data, which are detected by the sensor 102 and forwarded to the control unit 101.

Depending on implementation, the controller 103 can be any form of computing device capable of sending control, telemetry, audio, video, or other data signals to a UAS, e.g., the drone 105. For example, the controller 103 can be a laptop computer, a desktop computer, a smartphone or other handheld electronic device, or any other device able to encode and transmit, through connected antennas, control signals to the drone 105. In some cases the signals may be relayed via other devices, such as a satellite.

The control unit 101 processes the RF data as RF snapshot dataset 104. In some cases, the control unit 101 may process any segment of samples, such as a series of streaming samples traversing a First In First Out (FIFO) or Direct Memory Access (DMA) buffer. In some implementations, the control unit 101 includes an SDK running on an electronic device, e.g., a computer. Based on the RF snapshot dataset 104, the control unit 101, or the SDK corresponding to the control unit 101, may generate an annotated training dataset 110 for training a neural network 112. After training the neural network 112, the model file 114 of the trained neural network 112 may be used by a sensor engine 115 communicatively connected to the control unit 101 to detect a signal 116 and provide an indication to a user device 118 also communicatively connected to the control unit 101. In some implementations, the sensor engine 115 obtains signals detected by the sensor 102. For example, the sensor engine 115 may obtain signals detected by the sensor 102 and then process the detected signals according to the model file 114 of the trained neural network 112.

Stages A-D of FIG. 1 illustrate an example process for training and detecting radio signals from drones, e.g., drone 105. The process begins with the building of the training set as shown in stages A and B of FIG. 1. Initial snapshots of RF signals may be obtained by the control unit 101 based on signal data obtained by the sensor 102. A snapshot may include signal information (e.g., an electromagnetic energy profile) captured by the sensor 102 in a given time period. The snapshots may include capturing or obtaining over-theair (OTA) snapshots of radio signals emitted by the drone 105 in a variety of operating modes. The snapshots may be recorded at a location of a property (e.g., in a laboratory or a stairwell of an office building), or outdoors in the street or other open area, or some other suitable location (collectively referred to as the field). In some implementations, other setups to capture the snapshots may be used. Radio signals from a drone can be captured or obtained by scanning for signals in an environment, e.g., using the sensor 102 or some other suitable antenna that can detect RF signals. The RF snapshot dataset 104 may be generated by the control unit 101 based on signal data obtained by the sensor 102. The control unit 101 may store the RF snapshot dataset 104 in a database in memory communicatively connected to the control unit 101. The SDK is executed by the control unit 101 and provides one or more processes to manipulate the RF snapshot dataset and use the neural network 112 to generate a model file. The SDK also provides a user interface to control operations of the one or more processes. The SDK may obtain the RF snapshot dataset 104. The SDK may enable a user of the control unit 101, or an automated process running on the control unit 101, to annotate, curate, and manage the RF snapshot dataset 104 as discussed in stage B below. In some implementations, other devices or systems may be used to annotate, curate, and manage data.

In stage C, the snapshots may be labeled using the SDK to generate annotated training dataset 110, which is provided to training routines corresponding to a neural network 112. The training routines create a neural network model file 114 representing the neural network 112. In some implementations, the model file 114 may represent a fully trained version of the neural network 112. In some implementations, the model file 114 represents parameters (e.g., network node values or weights) used to generate a neural network having characteristics similar to the trained neural network 112.

The neural network model file 114 is then, in stage D, passed to the sensor engine 115. The sensor engine 115, based on a corresponding neural network configured by the model file 114, may detect and identify new radio signals in the field in real-time. In some cases, the neural network model file 114 may be used to configure a neural network deployed in a detection system in the field to enable the detection system to identify signals that are similar to the signals of the RF snapshot dataset 104 used to train the neural network 112 (e.g., some of the weights or other structures of the neural network).

In some implementations, the sensor 102 and the SDK corresponding to the control unit 101 are combined to enable a full capability development process. For example, as shown in FIG. 1, the sensor 102 may obtain snapshots of RF signals from drones, e.g., drone 105, in a variety of operating modes. The RF snapshot dataset 104 may be generated by the SDK based on the RF signals obtained by the sensor 102. In some cases, the RF snapshot dataset 104 may be generated, at least in part, by an automated RF data model or algorithm configured to produce RF data of a determined type.

Snapshots of RF signals used for detecting and identifying from drones can be captured using different hardware and software platforms. In some implementations, the RF snapshot dataset 104 may be generated using a software-defined radio (SDR). For example, the RF snapshot dataset 104 may be generated using a SDR running on the control unit 101. The SDR may obtain RF data from the sensor 102 and then process the RF data to generate the RF snapshot dataset 104.

In some implementations, RF data may be obtained from other sources, such as one or more other devices including one more other types of drones. For example, without obtaining a specific type of drone, a user may obtain RF data using a sensor that detects signals from one or more types of drones that may be operating within a region. It is possible to use data captures from the field, for example in cases where one may not have access to a particular drone, to train a model, such as the neural network model 112, to detect and classify signals that are similar to the detected signals of the one or more types of drones that may be operating within a region. The RF data captured from the field may be used to build a training dataset. In some cases, data captured from the field may require additional selections of radio hardware and annotation of training data. The RF data captured from one or more types of drones (or other signal emitters of interest) that may be operating within a region may be used to supplement training data from a specific drone in order to improve signal detection and classification of both the specific type of drone and the one or more types of drones.

In some implementations, the control unit 101 is realized as a computing system (e.g., a desktop computer) with a diagnostic user interface, which may have a record feature that is capable of recording complex 32-bit float in-phase/quadrature (I/Q) data streams (or other formats such as 8-bit, 12-bit, 14-bit, or other resolution integer sample data in real or complex format representing a received radio emission) corresponding to RF data captured from one or more RF sources, such as the drone 105. In addition, the system may obtain data of multiple data types including, for example, complex 16-bit integer and complex 32-bit floats which may be used to describe RF data being captured from one or more RF sources.

The RF snapshot dataset 104 may include RF recordings from different radios. The RF snapshot dataset 104 may further maintain a high-performance classification even with RF recordings from different radios. The system 100 may use radios, for both signal detection and emission, from many different vendors for testing or demonstration purposes. Radio vendors may include, without limitation, Epiq Solutions, National Instruments, Herrick Technologies, Ettus Research, Analog Devices, Xilinx Radio Frequency Simulation Operations Center (RFSoC), and many more. Radios may include software defined radios (SDR), as noted previously. In general, any method of capturing or streaming RF snapshots can be used as known in the art.

In some implementations, the RF snapshot dataset 104 may include supplementary data. For example, elements of the system 100 may be trained to detect signals indicated by previously obtained data. In some cases, the previously obtained data is used to supplement the annotated training dataset 110 to train the neural network 112 in detecting and classifying signals of the previously obtained data. The previously obtained data may indicate signals emitted from the drone 105 or other radio devices, or other "background" RF environments. In some cases, training elements of the system 100, such as the neural network 112, may improve identification or classification of both the signals included in the dataset and signals not included in the dataset. For example, the system 100 may be tasked with identifying or categorizing a specific radio signal, such as a signal used by a specific device for control or information exchange. If the specific signal is in the RF snapshot dataset 104, the system 100 may correctly identify the specific signal. Similarly, if the RF snapshot dataset 104 includes one or more other signals different than the specific signal, the system 100 may be less likely to misidentify the one or more other signals as the specific signal, because the system 100 is more likely to identify the other signals correctly as being different than the specific signal. Accordingly, the RF snapshot dataset 104 may be supplemented with data obtained from a central database that indicates one or more previously obtained RF snapshots. In some cases, the RF snapshot dataset 104 based on data obtained from the drone 105 may be added to the central database and may supplement RF snapshot datasets used in subsequent training scenarios. In this way, the dataset may grow to include more data signals or data environments over time to correctly identify a greater number of signal types.

In some implementations, the supplementary data may include data indicating signal fade or other signal effects. The fade or other signal effects such as propagation or interference effects (sometimes called augmentations) may be used in training the neural network 112 to help identify one or more signals, in some cases in many different types of conditions. For example, a signal effect in a particular environment, such as large fades during inclement weather, signal attenuation near buildings with specific geometry, natural obstructions such as mountains, cliffs, and trees, among others, may be learned by the neural network 112. Based on the signal effect, the neural network 112 may be trained to detect a signal with certain characteristics, such as specific frequencies or amplitudes, according to the signal effect. A central server associated with the system 100 may push supplementary data to the control unit 101. The supplementary data may aid in training or runtime detection and classification. In some cases, the system 100 may push supplementary data to other systems. For example, the control unit 101 may push supplementary data, such as data corresponding to the model file 114 or the RF data included in the annotated training dataset 110, to other systems. The other systems may similarly use the supplementary data to aid in training or runtime detection and classification. In some cases, the supplementary data may include metadata information indicating one or more RF characteristics of a signal.

In some implementations, the RF snapshot dataset 104 may be generated, at least in part, using a processing device connected to a form of radio. For example, in one implementation, a computer (such as a desktop or laptop computer) with a graphics processor can be connected to a software-defined radio (SDR), and the computer is used to record radio signals from drones detected by the SDR. In some cases, the RF snapshot dataset 104 is generated in an isolated environment, which can help with labelling the data as it helps minimize unwanted signals.

The drone 105 may be any type of drone. In a specific example, the drone 105 may be a DJI Mavic Pro™ drone, a DJI Phantom™ drone, or another model. In this case, signals from the drone 105 may operate in the 900 MHz, 2.4 GHz, 5 GHz, or other frequency bands. Other drones that can be used may operate in a wide range of different frequency bands.

In some implementations, during capturing RF signals from a drone, a manual or fixed channel configuration of the drone, if supported, is enabled. For example, by enabling manual or fixed channel configuration a given drone and a corresponding drone controller can be locked onto a single frequency band, which can be more easily identified than multiple bands. The single frequency band can also prevent the drone from reconfiguring its frequency bands while recording is happening.

In some implementations, the manual or fixed channel configuration can be changed back to a previous setting, e.g., auto or the like, after signal capture. For example, the drone 105 may support manual or fixed channel configuration. The manual or fixed channel configuration of the drone 105 may be enabled by a user of the system 100 prior to obtaining the RF snapshot dataset 104. The drone 105 may revert to an auto setting, or other previously enabled setting, after the one or more signal captures for the RF snapshot dataset 104.

In some implementations, the drone 105 may be configured to use a manual channel setting, e.g. in the middle of the 2.4 GHz ISM band. In other implementations, other frequencies are used. For example, any frequency within the RF spectrum can be used within signal captures.

In stage B, the RF snapshot dataset 104 including data obtained from the drone 105 is processed by the control unit 101 through one or more processing steps, which include auto management 106 and user management 108. In general, either one or both of auto management 106 and user management 108 may be used. In some cases, either one of auto management 106 or user management 108 may be combined with other processing steps to generate the annotated training dataset 110.

Figure 6:
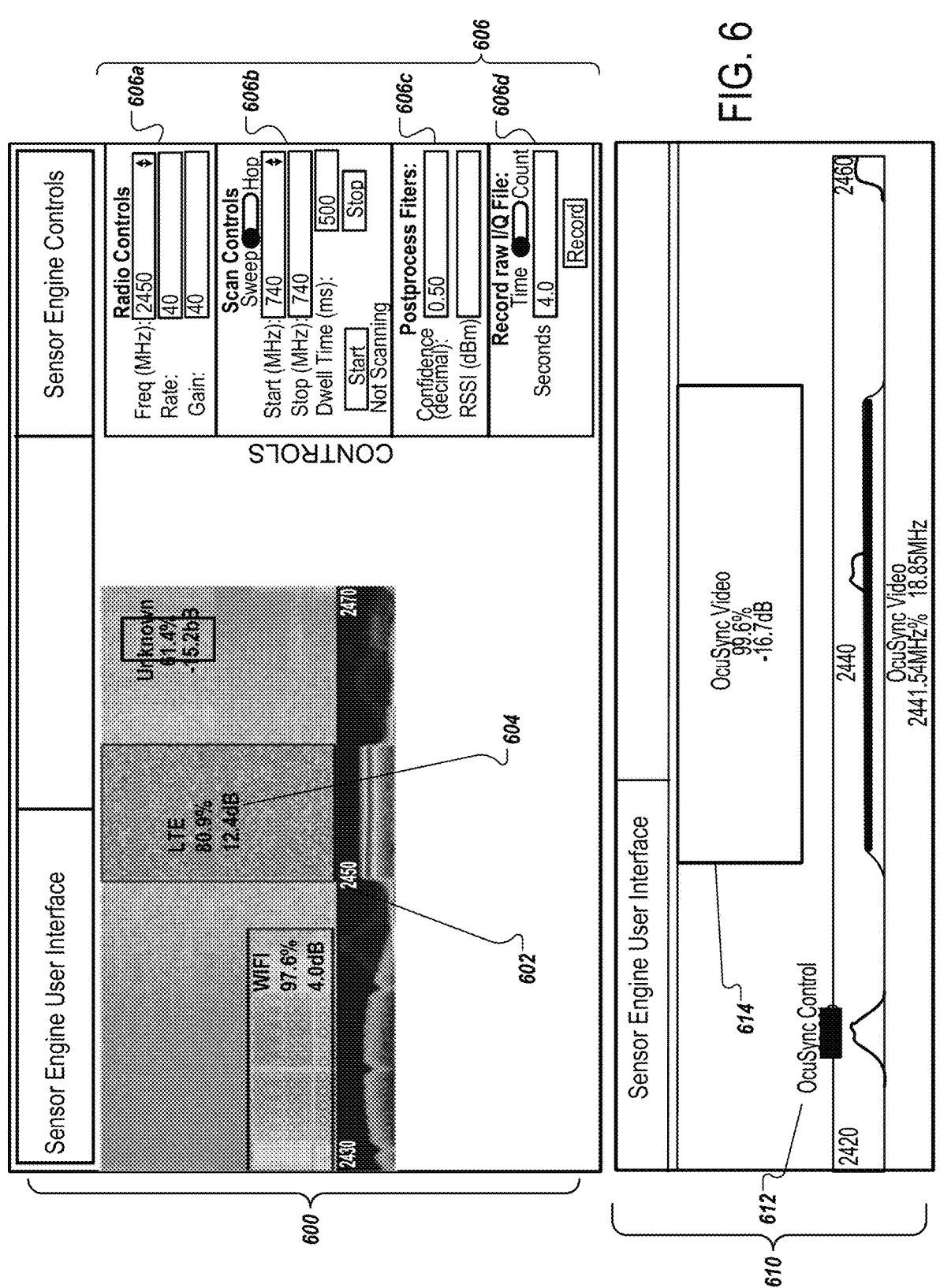
FIG. 6 is a diagram showing user interface elements for a software development kit (SDK) and/or a deployed sensor inference engine to detect and classify radio signals.
Figure 7:
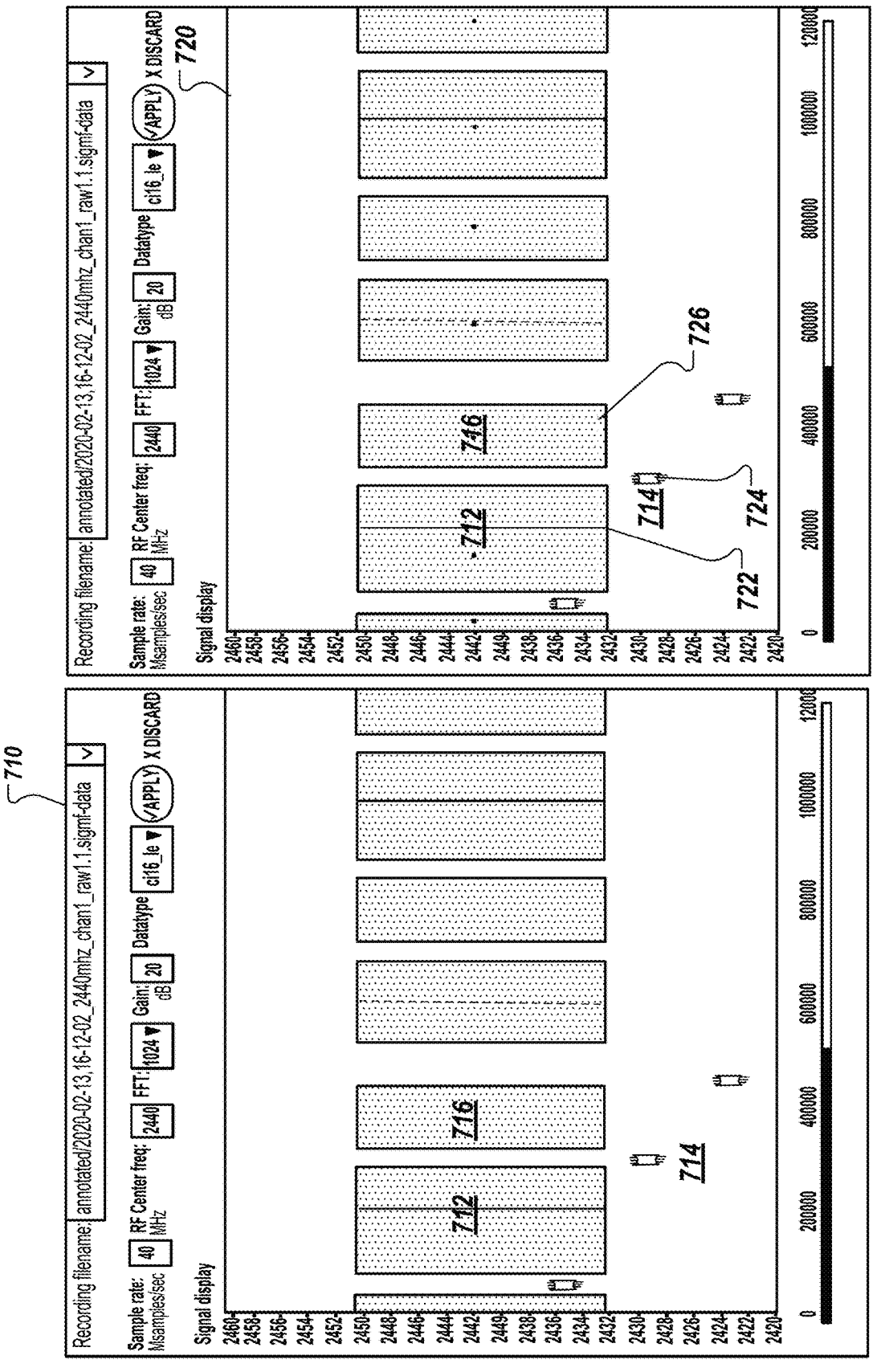
FIG. 7 is a diagram showing user interface elements for a software development kit (SDK) to annotate captured radio signals.
Figure 7:
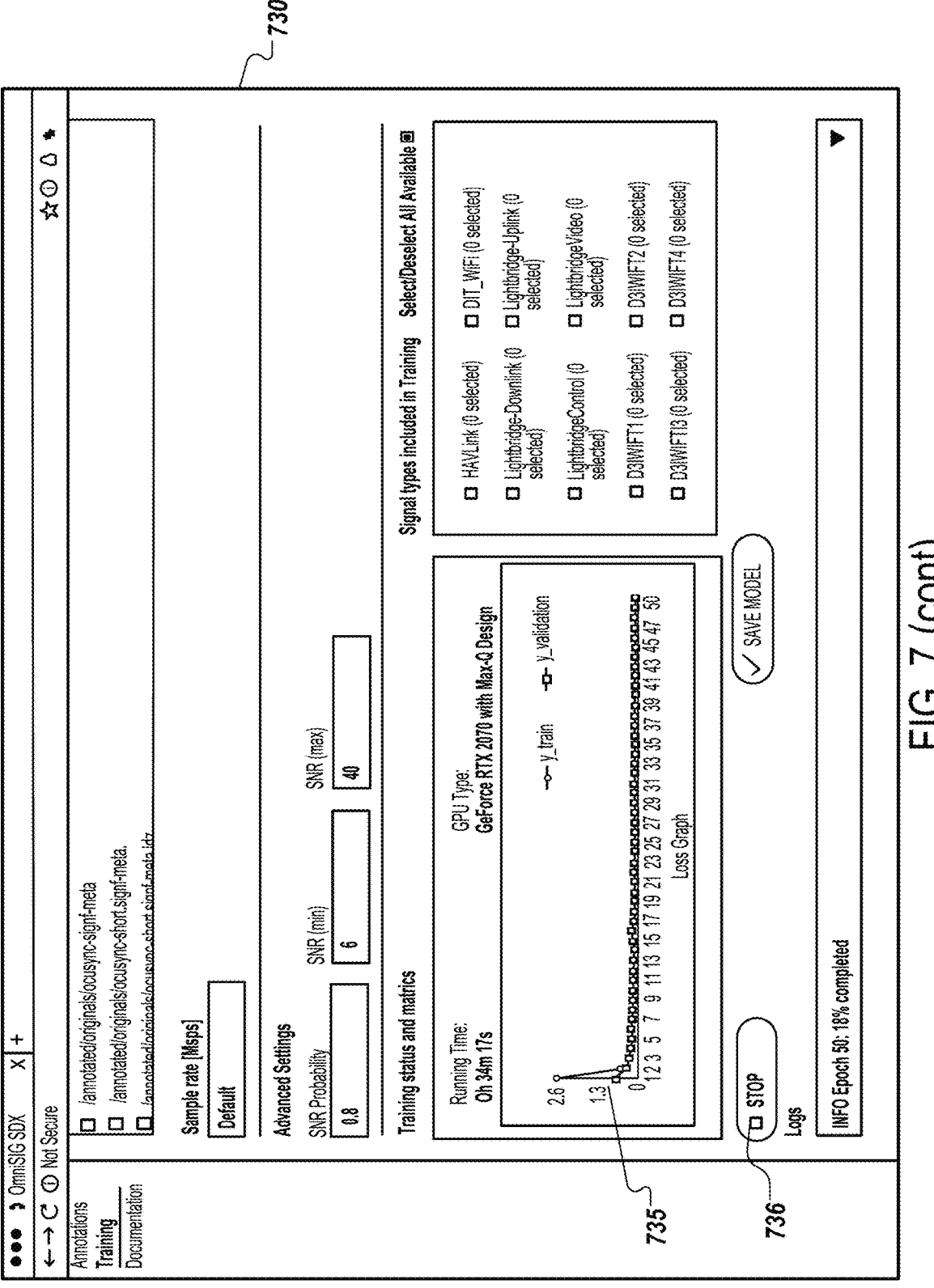

In some implementations, the auto management 106 may include a trained machine learning model configured to detect and annotate signals (e.g., label signals) represented in RF snapshots of the RF snapshot dataset 104. In some implementations, the user management 108 may include a user interacting with the control unit 101 through an input/output (I/O) user interface to annotate a representation of RF snapshots within the RF snapshot dataset 104. The user interface may include a graphical user interface (for example, presented on a display device connected to a computer corresponding to the control unit 101) that presents one or more RF snapshots graphically with signal details to enable a user to mark a portion of the one or more RF snapshots as a determined signal. Portions of graphical user interfaces that are used in various implementations are shown in FIG. 6 and FIG. 7.

The labels used to annotate RF snapshots of the RF snapshot dataset 104 indicate classifications of one or more signals within the RF snapshot dataset 104.

In some implementations, storing the RF snapshot dataset 104 may include storing the RF snapshot dataset 104 in memory coupled to the control unit 101. For example, the RF snapshot dataset 104 that has been obtained can be transferred to a database of the system 100. In some implementations, a user may simply drag and drop the RF snapshots of the RF snapshot dataset 104 obtained from the radio signals of the drone 105, or interface representing files associated with the drone 105, into a web-based or offline SDK database. In some implementations, the SDK database allows access to files, such as the files associated with the drone 105, for the rest of the SDK functions. In some implementations, an automated process of transferring RF snapshots to the SDK database may be used. For example, a process running on a computer may transfer RF snapshots to the SDK database responsive to a predetermined condition (e.g., a user selection or user parameter criteria).

RF snapshots of the RF snapshot dataset 104 are annotated to indicate which bursts of energy correspond to signals. For example, RF snapshots of the RF snapshot dataset 104 may be annotated to indicate which bursts of energy correspond to uplink and downlink signals of the drone 105. For example, in some implementations, the downlink signal of the drone 105 may include 10 or 20 MHz wide OFDM bursts, while the uplink signal may include a frequency hopper that is transmitted during gaps in the downlink. The downlink and uplink signals may be annotated and labeled separately, e.g., with their own specific signal type, and may use a wide variety of modulations, data-rates, and communications system structures.

In some implementations, RF snapshots of the RF snapshot dataset 104 can be marked up by a user, within the user management 108 process, or other entity such as an automated process, such as the auto management 106 process. For example, in the latter case, a machine learning model may be used to annotate the RF snapshots. In some implementations, annotations to the RF snapshots provide a method of screening a snapshot for any stray signal. For example, snapshots that include stray signals or other characteristics can be discarded or cropped.

In some implementations, once an RF snapshot dataset 104 has been annotated, a neural network model, e.g. neural network 112, may be trained using the corresponding annotated training dataset 110, without relying on additional datasets. Additional RF snapshots can be run through the system 100 using the trained model. Files with data output by the trained model can then be imported into the SDK, and the signals can be accurately labeled with minor adjustments. For example, the user management 108 process may run for a portion of a first snapshot of the RF snapshot dataset 104. A labeling model may be trained, based on the user management 108 process. The labeling model may then be used to perform the auto management 106 process. The labeling model may process one or more additional RF snapshots of the RF snapshot dataset 104 based on the input of the user management 108 and one or more additional training data sets.

In some implementations, annotating RF snapshots of the RF snapshot dataset 104 may include drawing boxes around the active signal regions and assigning a label. An example of drawing boxes around signals on a user interface is shown in FIG. 7. In some implementations, a snapshot may take a finite amount of time to be annotated in this manner. For example, a one-second snapshot of the RF snapshot dataset 104 may take about 15-20 minutes to annotate by an experienced user. This is due in part to the fact that a one-second snapshot may include hundreds of RF signal bursts to be annotated. Once the annotations are complete, a metadata file that includes the annotated data (e.g., the annotated training dataset) can be saved. In some implementations, the metadata file may be saved in the same location as the actual RF snapshot or snapshots. In other implementations, the metadata file is saved in other locations accessible to the system 100.

Auto management 106 can be used to assist users in the annotation process. In some implementations, auto management 106 may include providing a triage of the data. The auto management 106 may also draw boxes around the energy in an automated fashion. The data, e.g., RF snapshots of the RF snapshot dataset 104, may be triaged so that the user only needs to annotate a subset of the data. For example, in some cases, a user can run the auto management 106 and, after the auto management 106 is complete, the user annotates one or more data items e.g., 20-30% of the RF snapshot dataset 104. In some implementations, the auto management 106 annotates at least a portion of the RF snapshot dataset 104 (e.g., the auto management 106 may include a neural network that is trained on one or more user annotations to annotate new portions of RF datasets). In some implementations, the auto management 106 annotates 100% of the RF snapshot dataset 104.

In some implementations, data items may be evaluated and chosen for user annotation based on a set of predetermined criteria, which include burst size, burst length, burst frequency band, modulation type, or other expert features describing the burst, among other criteria. Data items that are selected for user annotation can be annotated by a user in the user management process 108. Data items that are not selected for user annotation can be annotated by the auto management process 106. By using the auto management 106, more time can be spent in the training process as opposed to the labeling and annotation process, which can increase efficiency of the training and detection process.

In stage C, the system 100 has obtained the annotated training dataset 110 and the annotation process is complete. Once annotation is complete, the files to be included into a new custom model can be selected. For example, once annotation is complete for all the data of the signals of interest, in this case, the RF snapshot dataset 104, a user or other automated process can select the files to be included into a new custom model, for example selecting files that contain signals of interest or background environments of interest using which a model is desired to be trained. A user may use a graphical user interface to select the files or to initiate an automated process to select the files.

In some implementations, training the neural network 112 may commence in response to a user input. For example, a user may select, on a user interface displayed using a display device associated with the control unit 101, an option to use the annotated training dataset 110 to train the neural network 112. The selection of the option triggers the SDK associated with the control unit 101 to train the neural network 112 based on the selected annotated training dataset 110.

In some implementations, a user interface displays information representing the training of the neural network 112. For example, the user interface may present a basic loss curve that indicates how well the training process is proceeding. An example loss curve is shown in item 735 of FIG. 7 and discussed below. In general, the lower the curve, the less error there is between the current set of trained weights and the automated test set that is created during the training process. For example, the neural network 112 may be trained iteratively using gradient descent (GD) or similar methods, such as Adam, AdaGrad, Radam, MadGrad, Adamax, Adabelief, or a range of other similar techniques. The neural network 112 may use Hyperoptimization techniques to resolve hyperparamters in the network (e.g. through training main candidate networks), such as numbers of layers, filter sizes, decimation rates or any other network hyperparameter, using techniques such as Random Search, Genetic Algorithms, Tree Structured Parzen Estimators (TPE), Covariance Matrix Adaptation Evolution Strategy (CMA-ES), Reinforcement Learning or a variety of other suitable hype-parameter search processes.

In some implementations, the SDK corresponding to the control unit 101 stops the training once the loss curve converges. In other implementations, the user or other automated process can stop the training. For example, a user may select, through the displayed user interface, an option to stop the training process, which terminates training of the neural network 112. In another example, an automated process can stop the training of the neural network 112 once one or more predetermined criteria are reached. In some cases, an upper limit on the training time can be set. For example, a "max training time limit" threshold can be set to prevent excessive training times and allow an automated process to stop the training when the elapsed time is equal to or greater than the "max training time limit" threshold.

In some implementations, training the neural network 112 can include using both the annotated training dataset 110 and previously stored training datasets. Using the previously stored training datasets together with the annotated training dataset 110 can add to the robustness of the neural network 112 in real-world scenarios. This can also help to minimize false detections on similar signals, such as in the case of similar orthogonal frequency-division multiplexing (OFDM) signals.

In some implementations, a user may want a custom model that will only identify the annotated training dataset 110. In this case, the user may not supplement the annotated training dataset 110 with previously stored training datasets. In some implementations of using the neural network that only identifies signals of the annotated training dataset 110, other signals are either not identified or identified as "Unknown" signal types, or otherwise labeled to indicate that they are not likely similar to the signals included in the annotated training dataset 110.

Training can be performed on a variety of hardware platforms. As one example, in some cases, the neural network 112 may be trained on a laptop, desktop, or server with gaming graphics processor (e.g., an NVIDIA RTX3090™ GPU) and 8, 16, 24 or 32 gigabytes (GB) of video memory, or any other similar graphics or tensor computer processor or alternative memory amount.

As noted previously, the model file 114 is generated by training the neural network 112. The model file 114 may include parameter values or variables for one or more layers within a neural network model that represents the neural network 112. In stage D, the control unit 101 provides the model file 114 to the sensor engine 115. The sensor engine 115 may be configured on the control unit 101 or may be communicatively connected to the control unit 101. The sensor engine 115 may include a neural network. The neural network of the sensor engine 115 may be configured based on the model file 114. In some cases, the parameters or variables of one or more layers of the neural network of the sensor engine 115 may be set based on the parameters or variables of one or more layers saved in the model file 114. The sensor engine 115 may then be used to detect and identify new radio signals from drones. The one or more new radio signals may have characteristics similar to those of the signals in the annotated training dataset 110.

In some implementations, the sensor engine 115 uses the neural network 112, instead of a separate neural network. For example, the control unit 101 may include the sensor engine 115. The control unit 101, after training of the neural network 112 may enable the sensor engine 115 to input data into the neural network 112. The control unit 101 may further enable the sensor engine 115 to obtain output data of the neural network 112. The neural network 112 may receive, as input data, snapshots of RF signals from drones, and may generate output data identifying one or more signals as specific types of signals. The neural network 112 may further process the identified signals to determine data encoded within the signals.

In some implementations, the sensor engine 115 may be deployed by a user. For example, once the neural network 112 is trained and the model file 114 is generated, a graphical user interface (GUI) may be used to activate the sensor engine 115 with the new custom detection model based on the trained neural network 112. The memory location of the model file 114 can be provided as a command line parameter when starting the sensor engine 115. Providing the location of the model file 114 as a command line parameter may cause a neural network within the sensor engine 115 to use the parameters and labels indicated in the custom model of the model file 114 as opposed to a default model that is built into an implementation of the sensor engine 115. In some implementations, multiple models may be provided to the sensor engine 115. For example, two separate models for detecting two separate signals may be provided such that a first model of the two separate models can be used to detect a first subset of signals and a second model of the two separate models can be used to detect a second subset of signals by the sensor engine 115. In this way, more signals may be detected with greater accuracy. In some implementations, the model file 114 may also be provided by a network URI, or pushed over a network protocol from a training or control node to a sensor or inference node. For example, a model training and management server may deploy updated model files to one or more sensors to provide updated or improved model definitions for inference.

In some implementations, the file size of the model file 114 may be in the order of megabytes (MB) or more. For example, the size can be in a range of 2 to 200 megabytes (MB) in some cases, or other suitable ranges. The model file 114 may be pushed over a network to a remote sensor system to immediately enable new capabilities, such as new detection and identification capabilities. This process is shown in reference to FIG. 3 and system 300.

In some implementations, a diagnostic GUI is associated with the sensor engine 115. The diagnostic GUI may be displayed on the device 118 and used to verify that a trained model is operating correctly. For diagnosis purposes, a test drone may be powered on and radios of the test drone may be tuned to uplink and downlink frequencies that may be known to the sensor engine 115. The diagnostic GUI may display detections equivalent to the labels that the snapshots were annotated with. For example, as shown with respect to FIG. 6, if the downlink signal and uplink signal correspond to labels "OcuSync Video" and "OcuSync Control", the sensor engine 115 detects and identifies the downlink signal and uplink signal corresponding to the labels "OcuSync Video" and "OcuSync Control." The sensor engine 115 indicates the identification using the diagnostic GUI.

In some implementations, an engineering GUI is displayed on the device 118. The engineering GUI is used to represent one or more signals detected and/or identified by the sensor engine 115, for example, when used to detect and identify drone radio signals obtained from the field.

In some implementations, the sensor engine 115 may output a stream of classifications to the device 118 for further action. The sensor engine 115 may publish annotations, which may include the stream of signal classifications, several different ways, including, but not limited to, ZeroMQ, Transmission Control Protocol (TCP), User Datagram Protocol (UDP), web sockets, over the network to an ElasticSearch database for analysis with the Kibana data visualization tools (e.g., the Elasticsearch, Logstash, and Kibana (ELK) software stack), to other databases such as MySQL or MongoDB, or simply output to files.

In some implementations, the sensor engine 115 may be used to explore the RF environment around a user and identify radio emissions, trends, or anomalies. For example, a user, who employs the sensor engine 115 to detect and identify drone signals, may be equipped with a network device configured to obtain RF snapshots. In some cases, the network device may include one or more antennas configured to obtain RF data from signals emitted by drones in the field. Depending on implementation, the network device may be a smartphone, a computer, or some other suitable electronic device. In some cases, the network device may include the control unit 101 and corresponding components, such as the sensor 102 and/or the sensor engine 115. The RF data may be obtained and provided to the sensor engine 115. The sensor engine 115 may then detect and identify signals within the obtained RF data. The sensor engine 115 may generate detection or identification data that may be used to generate spatial, temporal, or spectral visualizations (e.g., shown using the engineering GUI on the device 118) that allow a user to explore an RF environment and identify radio anomalies. The sensor engine 115 may be used along with one or more components of an ELK stack.

In some implementations, a Kibana dashboard (or any other similar such analytics UI) may be used (e.g., shown using the engineering GUI on the device 118) to view the distribution of signal types that are detected in a scanned radio spectrum. For example, radio frequency may be indicated along an x axis of the Kibana dashboard. Signal type may be indicated along a y axis of the GUI. One or more signals detected or identified may be presented within a graph in the GUI of the x and y axis, or within a heatmap or z axis.

In some implementations, the sensor engine 115 may be integrated into an existing system, e.g., to act as the flexible front-end RF signal survey component. In some cases, integrating the sensor engine 115 into another system may be achieved by developing the sensor engine 115 using standardized or open specifications, and users may be provided with well documented API's for the input, control, and output of the sensor engine 115. In some implementations, the sensor engine 115 is able to increase the sensing and scanning speed of these other systems while also adding in new ways to continually evolve the capabilities of the system. In some implementations, the sensor engine 115 is used to detect and classify any given signal by training using a relatively small amount of data related to a given signal as described with the RF snapshot dataset 104. In some implementations, the sensor engine 115 is used to detect and identify commercial cellular signals, or some other unknown signal type, in addition or as an alternative to its use for drone signals.

In some implementations, the sensor engine 115 may classify signals using confidence levels or generated pseudoprobabilities. For example, the sensor engine 115 may classify signal 116 using a protocol known to the sensor engine, that is similar to a different protocol associated with the signal 116. For example, the signal 116 may use the Ocusync protocol, which is similar to a Long-Term Evolution (LTE) protocol that is known to the sensor engine 115. The sensor engine 115 may use the neural network model file 114 to classify the signal 116 with a particular confidence level (e.g., a confidence level of 80.9% or some other suitable value). In some implementations, any confidence level below a set threshold would indicate that the signal may be a different signal type. For example, the threshold may be set at a 90% confidence level, and a confidence level of 88% associated with the classification of a particular detected signal may indicate that the detected signal is actually of a type different than the classified type. This can be the case, for example, when the neural network model 112 (and equivalently, the sensor engine 115) may not have been trained for signals of the type corresponding to the detected signal. If the confidence level is below the threshold, the sensor engine 115 may provide an indication (e.g., using the engineering GUI displayed on the device 118) that the signal is similar in signal features to signals used in training but may not be equivalent to these signals.

In some implementations, the sensor engine 115 may provide indications using a user interface. For example, a user may make a selection on the diagnostic GUI interface corresponding to the sensor engine 115 described herein (e.g., the user may select an option rendered on a GUI). In some cases, the selection of the diagnostic interface corresponding to an element may provide controls to the user. The controls may include an option to record signals obtained by a sensor component of the sensor engine 115. In some implementations, the signal recordings can be based on time, number of samples, or other suitable metric.

In some implementations, a snapshot dataset may be obtained using a GUI. For example, a user may start the sensor engine 115 using a corresponding software application and navigate to the diagnostic GUI. Controls presented in the diagnostic GUI may be used to tune a sensor, such as the sensor 102 of the system 100, to find the drone uplink and downlink signals. The user may adjust the gain so that a given signal may be clear without clipping the signal. The user may then set a record duration (e.g., the user may set the recorder to a duration in units of seconds or some other suitable recording interval). The sensor engine 115 may then be configured, after setting the record duration, to record snapshots for the length of time specified in the record duration. The snapshots may be included in an additional dataset to further train a model, such as the neural network 112, or may be stored and used for training of other models, such as models of other systems. Additional signals within the duration or after the duration may be captured and may be used if some of the other captured signals are contaminated with too many interfering signals.

In some implementations, pre-recorded snapshots from another device may be obtained by the system 100 for processing the snapshots. In some implementations, snapshots having different recording durations, or different numbers of snapshots to be obtained, may be used. In general, any method for recording or obtaining RF snapshots can be used, provided the data gets written to disk. For example, the data can be written to the disk in a variety of formats including complex 16-bit integer or 32-bit float formats.

In some implementations, a recording duration may be set to record a number of transmissions. For example, a duration of 15 seconds can be used to record one or more transmissions from the drone 105. In some implementations a trigger, such as energy correlation or detection, or other such algorithm, may be used to cause a recording of one or more bursts of energy or events to capture various phenomena for recording, labeling, and/or training. In some implementations, a subset of the one or more transmissions can be used for training. In some cases, predetermined criteria can be used to determine the subset of the one or more transmissions. For example, 5 seconds of the one or more transmissions based on predetermined criteria can be used for training. In some implementations, predetermined criteria can include signal clipping due to high gain or interference such as interference from unknown emitters. In some implementations, the process can be further enhanced by taking a drone used for signal capture, such as the drone 105, to an area outside where it can be flown in a real-world environment and additional captures could be taken while real in-flight control signals are also present. In such cases, way, the drone 105 may be a test drone used to help train the system 100 to detect signals specific to the drone 105 and other drones that generates signals similar to the signals generated by drone 105.

Figure 2:
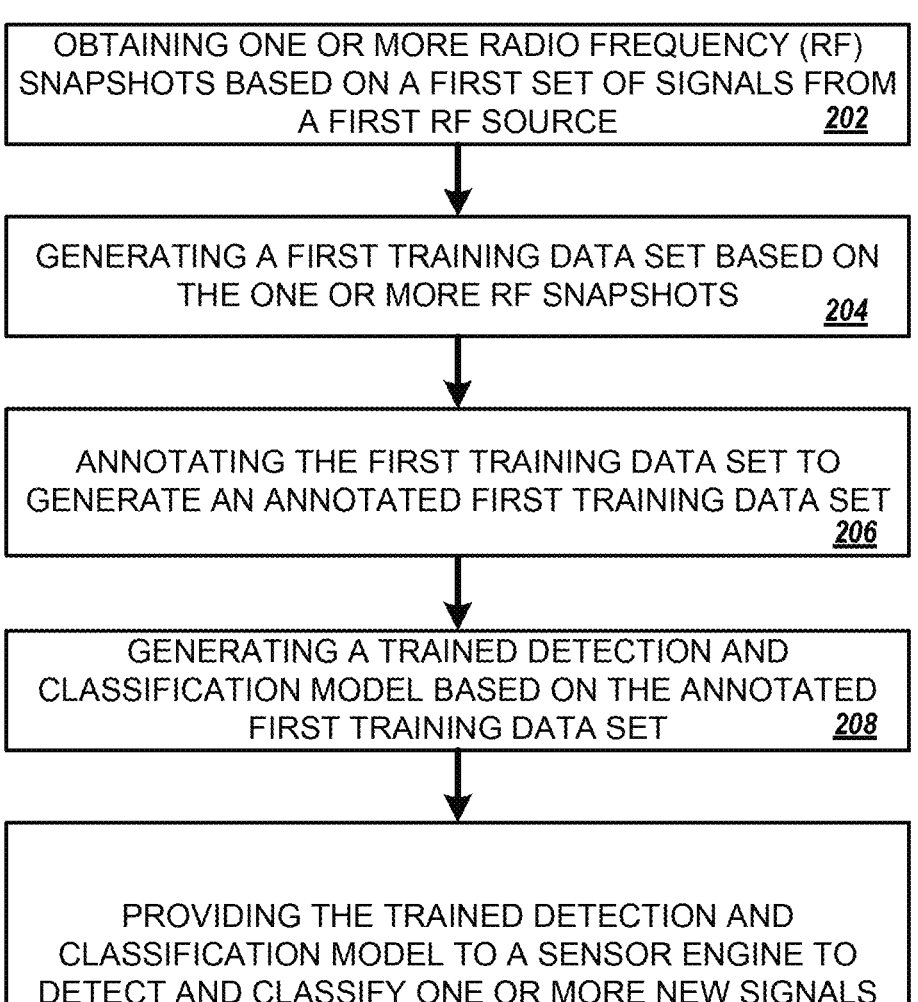
FIG. 2 is a flow diagram illustrating an example of a process for detecting radio signals emitted by drones.

FIG. 2 is a flow diagram illustrating an example of a process 200 for detecting radio signals emitted by drones. The process 200 may be performed by one or more electronic systems, for example, the system 100 of FIG. 1.

The process 200 includes obtaining one or more radio frequency (RF) snapshots based on a first set of signals from a first RF source. For example, as shown in FIG. 1, the sensor 102 of the system 100 obtains the RF snapshot dataset 104 from the drone 105 and/or the drone controller 103.

The process 200 includes generating a first training data set based on the one or more RF snapshots. For example, the RF snapshot dataset 104 may be generated by the control unit 101 based on signal data obtained by the sensor 102. The control unit 101 may store the RF snapshot dataset 104 in a database in memory communicatively connected to the control unit 101. In some cases, the RF snapshot dataset 104 may be supplemented with data obtained from a central database that indicates one or more previously obtained RF snapshots.

The process 200 includes annotating the first training data set to generate an annotated first training data set. For example, as shown in stage B of FIG. 1, the RF snapshot dataset 104 including data obtained from the drone 105 is processed by the control unit 101 through one or more processing steps, which may include auto management 106 and user management 108. In general, either one or both of auto management 106 and user management 108 may be used. In some cases, either one of auto management 106 or user management 108 may be combined with other processing steps to generate the annotated training dataset 110 for training the neural network 112.

The process 200 includes generating a trained detection and classification model based on the annotated first training data set. For example, the neural network 112 may be trained iteratively by one or more components of the system 100 using gradient descent (GD) or similar methods, such as Adam, AdaGrad, Radam, MadGrad, Adamax, Adabelief, or a range of other similar techniques. The neural network 112 may use Hyperoptimization techniques to resolve hyperparamters in the network (e.g. through training main candidate networks), such as numbers of layers, filter sizes, decimation rates or any other network hyperparameter, using techniques such as Random Search, Genetic Algorithms, Tree Structured Parzen Estimators (TPE), Covariance Matrix Adaptation Evolution Strategy (CMA-ES), Reinforcement Learning or a variety of other suitable hyperparameter search processes.

The process 200 includes providing the trained detection and classification model to a sensor engine to detect and classify one or more new signals. For example, the neural network model file 114 may be passed to the sensor engine 115. The sensor engine 115, based on a corresponding neural network configured by the model file 114, may detect and identify new radio signals in the field in real-time. In some cases, the neural network model file 114 may be used to configure a neural network deployed in a detection system in the field to enable the detection system to identify signals that are similar to the signals of the RF snapshot dataset 104 used to train the neural network 112 (e.g., some of the weights or other structures of the neural network).

Figure 3:
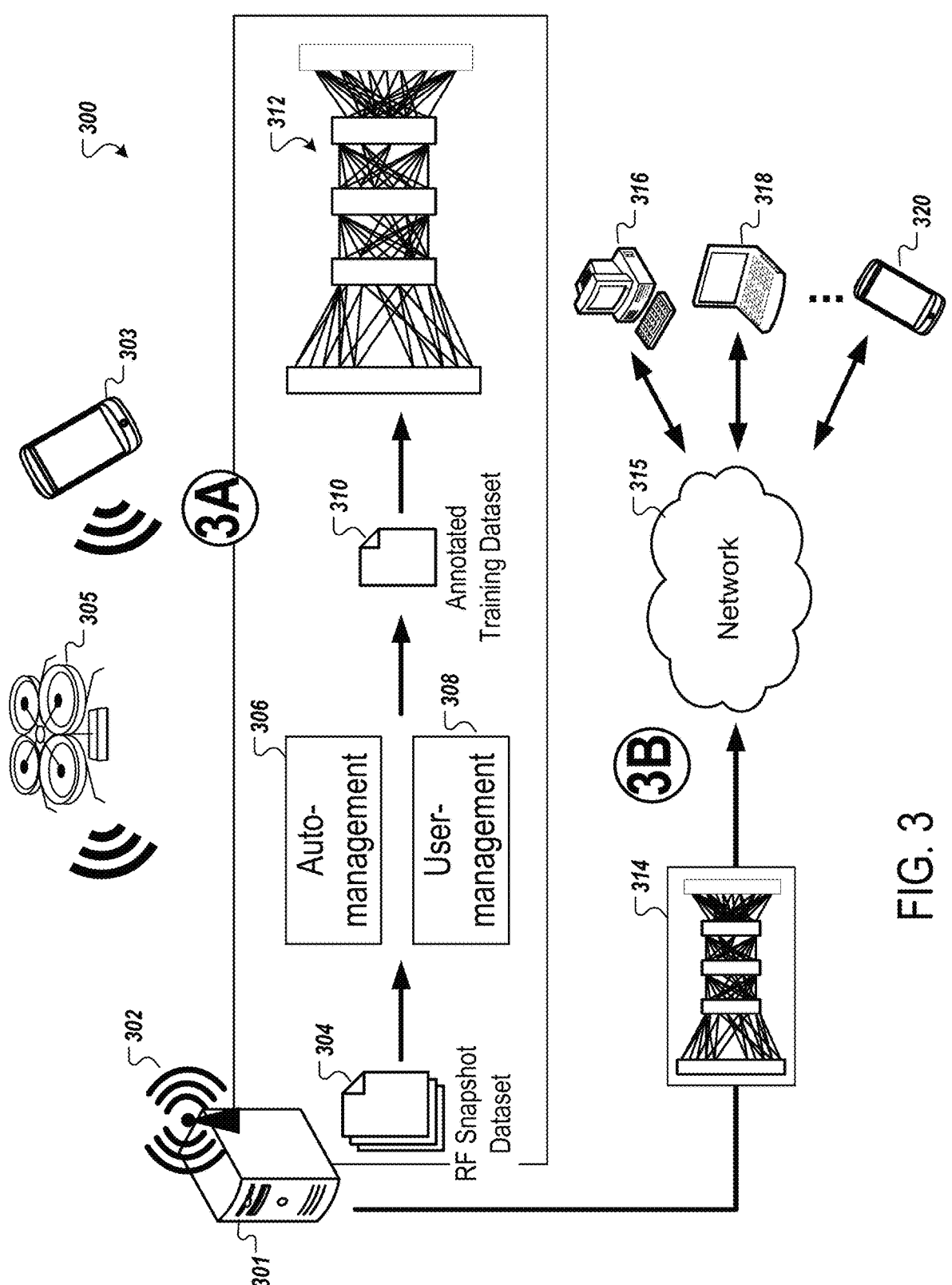
FIG. 3 is a diagram showing an example of a system for providing model data to sensors for detecting radio signals emitted by drones.

FIG. 3 is a diagram showing an example of a system 300 for providing model data to sensors for detecting radio signals emitted by drones. As shown, the operations of system 300 include two stages, stage 3A and stage 3B. Stage 3A is a training phase for generating a model file, using machine learning, that can be used to detect and identify radio signals emitted by drones. Stage 3B is a deployment phase, in which the model file is made available to be used in the field for detecting and identifying unknown radio signals from drones that are captured from the environment.

In some implementations, the processes of stage 3A are similar to those discussed with respect to stages A-C in FIG. 1. In such implementations, control unit 301 is similar to control unit 101, sensor 302 is similar to sensor 102, drone (or other RF emitter) 305 is similar to drone 105, drone controller 303 is similar to the controller 103, RF snapshot dataset 304 is similar to RF snapshot dataset 104, auto management process 306 is similar to auto management 106, user management process 308 is similar to user management process 108, annotated training dataset 310 is similar to annotated training dataset 110, neural network 312 is similar to neural network 112, and model file 314 is similar to model file 114. The model file 314 corresponds to the output of stage 3A, having been generated by training the neural network 312 using the annotated training dataset 310, in a manner similar to that described in FIG. 1 with respect to the neural network 112 and the model file 114.

In stage 3B, the system 300 provides the model file 314 to a network 315. The network 315 may be any suitable form of communications network capable of connecting two or more devices. For example, the network 315 may be the Internet or some other combination of public/private networks. Alternatively, the network 315 may be a local area network (LAN) connecting the control unit 301 and one or more of devices 316, 318, and 320. In general, any communications network that communicatively connects the control unit 301 to one or more of devices 316, 318, and 320 may be used as the network 315.

The control unit 314 sends the model file 314 to the devices 316, 318, and 320 over the network 315. The devices 316, 318, and 320 may be any type of electronic device capable of running a trained neural network model for detecting and classifying signals. For example, one or more of the devices 316, 318, and 320 may include desktop computers, laptops, smartphones, handheld monitors, or other electronic devices connected to antennas that capture radio signals. One or more of the devices 316, 318, and 320 may also be used as the controller 303 to transmit and receive command and control signals for the drone 305. In some implementations, one or more of the devices 316, 318, and 320 include a sensor engine similar to the sensor engine 115. The devices 316, 318, and 320 may use the respective component sensor engine to detect and classify/identify radio signals from drones in the field.

In some implementations, the control unit 314 may store the model file 314 in one or more connected network servers (e.g., in the network "cloud"). The devices 316, 318 or 320 may be able to access any of the network servers over the network 315 and obtain the model file 314. The devices 316, 318, and 320 may be configured to generate a network model based on the data of the model file 314. The generated network model, generated by each of the devices 316, 318, and 320, may then detect and classify radio signals similar to the signals indicated by the annotated training dataset 310.

In this manner, the system 300 is able to push model file updates over the network 315 to one or more devices connected to the system 300, including the devices 316, 318, and 320. Accordingly, the process of training a model may be centralized to take advantage of greater computing power and efficiency at a central location. Once learned, the weights and parameters of the trained neural network 312 may be included in the model file 314. Instead of duplicating a training process to detect and classify similar signal types across various devices, the system 300 may enable devices to detect and classify new signals by pushing updated network weights and parameters in the model file 314 based on training performed on the control unit 301.

As noted above, in some implementations, one or more network servers connected to the network 315 may store the model file 314, e.g., in databases in the network servers. The databases may be accessible to the devices 316, 318, and 320. In some cases, different databases may store different model files that include weights and parameters for neural networks configured to detect different types of signals, or signals in different scenarios or environments. For example, a device, such as one of devices 316, 318 or 320, operating in an urban environment may attempt to detect and classify a signal of a first type that is prevalent in the urban environment. The device may obtain a version of the model file 314 that is customized to detect and classify signals similar to the first type. In such cases, the RF snapshot dataset 304 may include signals of the first type obtained in an urban environment, and an annotated training dataset 310 may include annotated signals of the first type used to train the neural network 112.

In some cases, a version of the model file 314 may include an indication of types of signals used for training, as well as one or more indications corresponding to an environment (e.g., location, object within vicinity, time of day, country, among others) in which the signals were obtained.

In some implementations, the system 300 may push model files according to known parameters (e.g., location, operating use, among others) of the devices 316, 318, and 320 or may provide an interface for the devices 316, 318, and 320 to access model files. In some implementations, the devices 316, 318, and 320 may search the databases in the network servers connected to the network 315 to determine a version of the model file 314 that is suitable for a particular use case in the field.

In some implementations, the model file 314 includes data, e.g., values or weights and/or biases for neural network parameters, used to generate a neural network model. In some cases, the model file 314 may be the data for a generated model, e.g., the model file 314 may be a neural network model stored in a computer-readable format.

Figure 4:
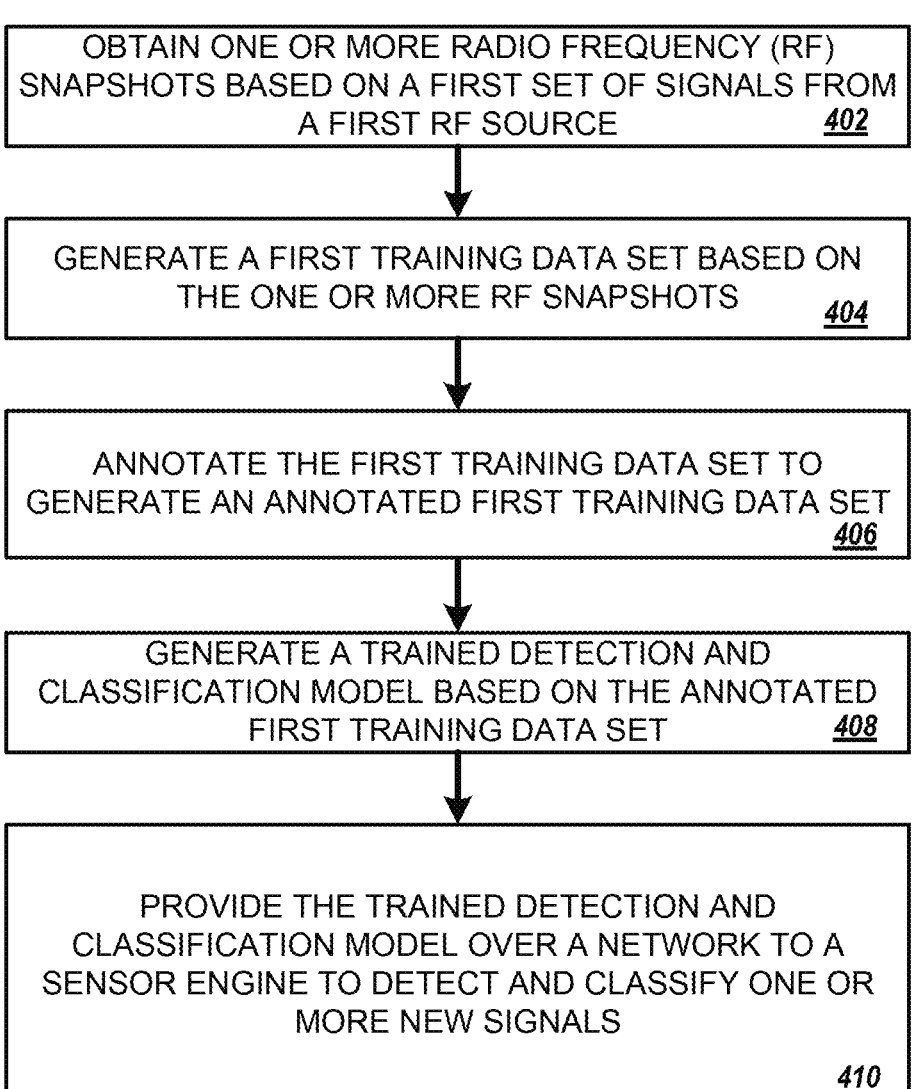
FIG. 4 is a flow diagram illustrating an example of a process for providing model data to sensors for detecting radio signals emitted by drones.

FIG. 4 is a flow diagram illustrating an example of a process 400 for providing model data to sensors for detecting radio signals emitted by drones. The process 400 may be performed by one or more electronic systems, for example, by the components of the system 300 of FIG. 3.

The process 400 includes obtaining one or more radio frequency (RF) snapshots based on a first set of signals from a first RF source (402), generating a first training data set based on the one or more RF snapshots (404), annotating the first training data set to generate an annotated first training data set (406), and generating a trained detection and classification model based on the annotated first training data set (408). Corresponding descriptions for the steps of 402, 404, 406, and 408 may be found in the process 200 of FIG. 2 and the steps of 202, 204, 206, and 208.

The process 400 includes providing the trained detection and classification model over a network to a sensor engine to detect and classify one or more new signals (410). For example, as discussed in reference to FIG. 3, the control unit 314 may make the model file 314 available to the devices 316, 318, and 320. In some cases, the control unit 314 may push the model file 314 to the devices 316, 318, and 320 over the network 315. In some cases, the control unit 314 may store the model file 314 in one or more network servers (e.g., in databases hosted by the servers), which can be accessed by the devices 316, 318, and 320 over the network 315.

Figure 5:
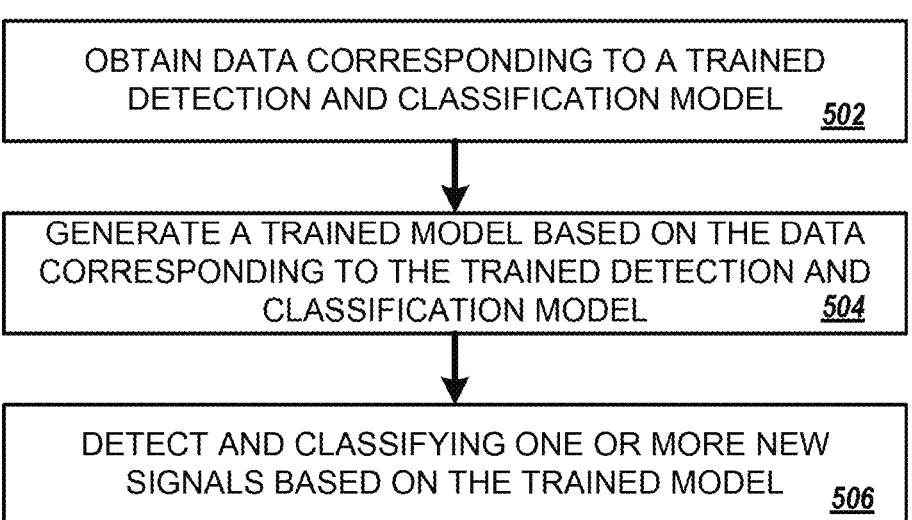
FIG. 5 is a flow diagram illustrating an example of a process for classifying radio signals captured from the field.

FIG. 5 is a flow diagram illustrating an example of a process 500 for classifying radio signals captured from the field. The process 500 may be performed by one or more electronic systems, for example, the system 100 of FIG. 1 or the system 300 of FIG. 3. In some cases, the process 500 may be performed by one or more of the devices 316, 318, and 320 of FIG. 3.

The process 500 includes obtaining data corresponding to a trained detection and classification model (502). For example, the devices 316, 318, and 320 may obtain the model file 314.

The process 500 includes generating a trained model based on the data corresponding to the trained detection and classification model (504). For example, the devices 316, 318, and 320 may obtain the model file 314 and generate a network model based on the data of the model file 314. The devices 316, 318, and 320 may generate a trained model similar to the neural network 112 or the neural network 312 as discussed herein. In some cases, rather than generating a trained model, the devices 316, 318, and 320 may obtain a version of the model file 314 that is a functioning model, to be run on computing components (e.g., one or more processors) of the devices 316, 318, and 320.

The process 500 includes detecting and classifying one or more new signals based on the trained model (506). For example, the devices 316, 318, and 320 may use the network model, determined based on the model file 314, to detect and classify RF signals emitted by drones in the field. As discussed in reference to FIG. 3, the devices 316, 318, and 320 may include a sensor engine that may be used to detect and identify a radio signal (e.g., similar to the signal 116 in FIG. 1). The devices 316, 318 and 320 may provide information about the identified signal to a user on a display coupled to the respective devices 316, 318, and 320.

FIG. 6 is a diagram showing user interface elements for a software development kit (SDK) and/or a deployed sensor inference engine to detect and classify radio signals. As shown, the user interface can present one or more panels 600 and 610, which provide information about radio signals detected by a system before and after training, respectively. In some implementations, the user interface and the panels 600 and 610 are displayed by the device 118 in the system 100, or by any of the devices 316, 318 or 320 in the system 300 of FIG. 3. For example, one or more of the panels 600 or 610 can correspond to the diagnostic UI or the engineering UI described with respect to FIG. 1.

The panel 600 provides graphical information 604 in item 602 about a detected signal. In some cases, the graphical information 604 indicates the type of the signal (e.g., LTE, as shown, or some other suitable type) and the strength of the detected signal (e.g., 12.4 decibels (dB) as shown, or some other suitable value). In some cases, the graphical information 604 includes a confidence value, which indicates the likelihood that the detected signal is actually of the type determined by the neural network model. For example, the confidence value can be 80.9% as shown, or some other suitable value. In some implementations, the user interface for such a sensor can display a range of detections of different types of RF emitters corresponding to those detected, aggregations of such information over time, specific alerting based on the type of devices and the threat or relevance it may pose based on security or other contextual posturing, or fusion of information such as RF signal detections with imagery data, radar data, infrared data, or any other sensor information which may provide complete information such as tracks, history, images, or logs of physical phenomena or activity corresponding with the detected emissions.

As shown, the graphical panel 600 also includes controls 606 for a user. The controls 606 may include radio controls 606a, scan controls 606b, postprocess filters control 606c, and record options 606d, among others. The radio controls 606a may include a frequency user input value for receiving signals, a rate user input value at which the signals may be received, as well as a gain user input value indicating the sensitivity of the detection of the signals. The scan controls 606b may include a starting frequency level and a stopping frequency level user input value within which to scan in frequency, a dwell time user input value controlling the scan across the frequency range, interactive controls for starting and stopping a scan, as well as a graphical indicator indicating whether or not the system is currently scanning or not. The postprocess filters control 606c may include a confidence threshold as well as a Received Signal Strength Indicator (RSSI), which may control the confidence or strength needed for the particular signal detection. The record options 606d may include an interactive element for switching between capturing based on time or based on signal count as well as a user input value specifying the amount of time or amount of counts to record and an interactive element to start or stop the recording. Recordings may be saved or exported to other systems or storage devices.

The graphical panel 610 includes a representation of a signal detected by a trained system, such as the system 100 or the system 300. The graphical panel 610 shows a control signal 612 and a video signal 614, providing information about the types of the signals (e.g., "OcuSync Control" or "OcuSync Video"), strengths of the signals as detected (e.g., 16.7 dB). The information also indicates a confidence value indicating the accuracy of the determination of the signal types. For example, the control signal 612 is detected with a confidence value of 88.8% and the video signal 614 is detected with a confidence value of 99.6%.

In some implementations, signals may be depicted using other methods. For example, as shown in FIG. 6, the detected signals may be shown in frequency time space. In some cases, textual readouts or graphical interfaces that indicate the presence of signals at specific frequencies or that correspond to known signal types, may be used. In general, any method to indicate to a user that a specific signal is detected based on the processing of the system may be used.

FIG. 7 is a diagram showing user interface elements for a software development kit (SDK) to annotate captured radio signals. As shown, the graphical user interface elements include graphical panels 710, 720, and 730. In some implementations, the user interface and the panels 710, 720 and 730 are displayed by the device 118 in the system 100, or by any of the devices 316, 318 or 320 in the system 300 of FIG. 3.

In some cases, the graphical panels 710 and 720 include annotation options for an SDK, e.g., the SDK described with respect to the system 100. The annotation options include input controls and display features.

The graphical panels 710 and 720 show signals being annotated by a user or automated or semi-automated systems as discussed in stage B of FIG. 1. For example, a user or automated system may identify detected signals 712, 714, and 716 and respective borders describing the regions of the signals 712, 714, and 716, such as a region within frequency time space and/or the type of signal or any other properties pertaining to the signal or the device or user that may be emitting it. The regions may be bounded as shown in items 722, 724, and 726. The signals 712, 714, and 716 may correspond to various control signals sent by a controller, such as the controller 103 of FIG. 1 or the controller 303 of FIG. 3, and received by a transmission device, such as the drone 105 in FIG. 1. The signals 712, 714, and 716 also may correspond to RF snapshots included in a dataset, such as the RF snapshot dataset 104.

The graphical panel 730 includes a graphical representation of training a neural network model performed using an SDK, e.g., training the neural network 112 using the SDK of the system 100. As shown, the graphical panel 730 includes a loss curve 735 that indicates how well the training process is proceeding. In general, the lower the curve, the less error there is between a current set of trained weights and the automated test set that is created during the training process. In some implementations, the SDK will stop training once the loss curve converges. In other implementations, the user or other automated process can stop the training. The graphical panel 730 may include an option 736 for stopping or starting the training process, as described with respect to the system 100. For example, a user may select an interactive control to control the training. By selecting the option 736, the user may stop the training. In another example, an automated process can control the SDK and stop the training once one or more predetermined criteria are reached. In some cases, a max training time limit can be set, as described with respect to the system 100. For example, a max training time limit can be set to prevent excessive training times and allow an automated process to stop the training based on the max training time limit.

In some implementations, the systems discussed herein (e.g., the system 100 and the system 300) may be configured to detect and classify radio signals of any known protocol. For example, the systems discussed herein may detect and classify signals embedded in standard 802.11 frames on either the 2.4 GHz or 5.8 GHz band of a Wi-Fi based system that include control and data packets. In some cases, a drone may automatically switch between the 2.4 GHz and 5.8 GHz bands based on the current wireless environment to avoid interference.

The drone 105 may be any known or unknown type of drone. For example, the drone 105 may be any of the following known types of drones, without limitation: Parrot Bebop 1, Parrot Bebop 2, DBPower UDI, DBPower Discovery, DJI Tello, Tenergy TDR, Wingsland, DJI Spark (without the DJI controller), or Mavic Air (without the DJI controller). In some cases, the drone 105 may include types of drones that use DJI's Ocusync and Lightbridge (LB/LB2) protocols. As illustrative examples, such drones include DJI Mavic Pro (Ocusync), Phantom 4 Pro V2.0 (Ocusync), Phantom 4 Pro (LB), Phantom 4 Advanced (LB), Inspire 2 (LB2), Matrice 200 Series (LB2) and Matrice 600 Pro (LB2). Unknown types of drones may include drones that have not yet been produced or invented but may function based on receiving or generating transmissions using electromagnetic radiation and may move within an environment.

In some implementations, Wi-Fi-based systems may be detected by the system 100 or the system 300 using standard 802.11 discovery mechanisms. Manufacturers can be allotted blocks of MAC addresses that allow the system 100 or the system 300 to discern whether a Wi-Fi enabled drone is in the local area. In some cases, manufacturers may have wireless network identifiers, such as SSIDs, that can be detected.

In some implementations, based on training, the system 100 and the system 300 may also detect and classify signals for drones that do not use Wi-Fi for their control and data, e.g., use proprietary signals. In such cases, non-Wi-Fi transmission systems may be used within elements of the system 100 and the system 300, such as the drone 105 or the drone 305, to detect and classify non-Wi-Fi and/or proprietary radio signals.

In some cases, non-Wi-Fi based transmission systems may include signals that range from very wideband OFDM signals, which typically carry data from the drone down to the controller, to small narrowband bursts that hop around the spectrum. The system 100 or the system 300 may be used to detect or classify corresponding signals.

In some implementations, range extension systems may be used in the system 100 or the system 300. For example, range extension systems may be used by drones or other transmission devices (such as devices that operate at a specific frequency band, e.g., 433 MHz). There may be different systems that operate in a specific frequency band, such as the 433 MHz band, each having their own signal type. These signal types may include variants of a narrowband Frequency Shift Keying (FSK) signal.

In some implementations, range extension systems may include: DragonLink, EzUHF, and OpenLRS, among others.

In some implementations, the sensor, and the SDK of the system 100 or the system 300, or both, may be used for both Wi-Fi (IEEE 802.11)-based and non-802.11-based signals. For example, if the signals are 802.11-based, a corresponding system may be paired with a Wi-Fi post-processor to help detect and classify the signals. In another example, if the signals are not 802.11-based, a corresponding system can be used to train a neural network to recognize the signals. In any case, a system, such as the system 100 or the system 300, can be used to detect and classify drone signals, including consumer drone signals. A system, such as the systems described herein, can also provide low SNRs. New signals may be detected and classified more quickly with the system than with traditional methods. For example, the SDK of the system 100 can enable adding new drone signals to the system within a short amount of time, e.g., in the order of a few hours.

In some implementations, elements of the system 100 and the system 300 may include general purpose controllers that use particular frequency regions. General purpose controllers may be used to control drone devices by transmitting control signals to the drone devices (e.g., a general purpose controller may transmit control signals configured to be received by, and control, the drone 105). For example, the general purpose controllers can use ISM bands (915 MHz, 2.4 GHz, and the 5.8 GHz bands) with complex frequency-hopping controllers such as those made by FrSky and FlySky, or long-range frequency-hopping telemetry systems that support the MAVLink protocol operating in the 433 or 915 MHz ISM bands. In some implementations, the controller 103 or the controller 303, or both, may be such general purpose controllers.

For general purpose controllers, the uplink, or the control signal from the controller to the drone can be a different signal type than the video feed coming from the drone to the operator. For example, a drone can use frequency-hopping controllers, MAVLink telemetry, and Wi-Fi video on the same platform, or a variety of different data carriers in the downlink or uplink carrying a range of information, such as sensor feeds, telemetry feeds, command and control, or other data configuration.

Figure 8:
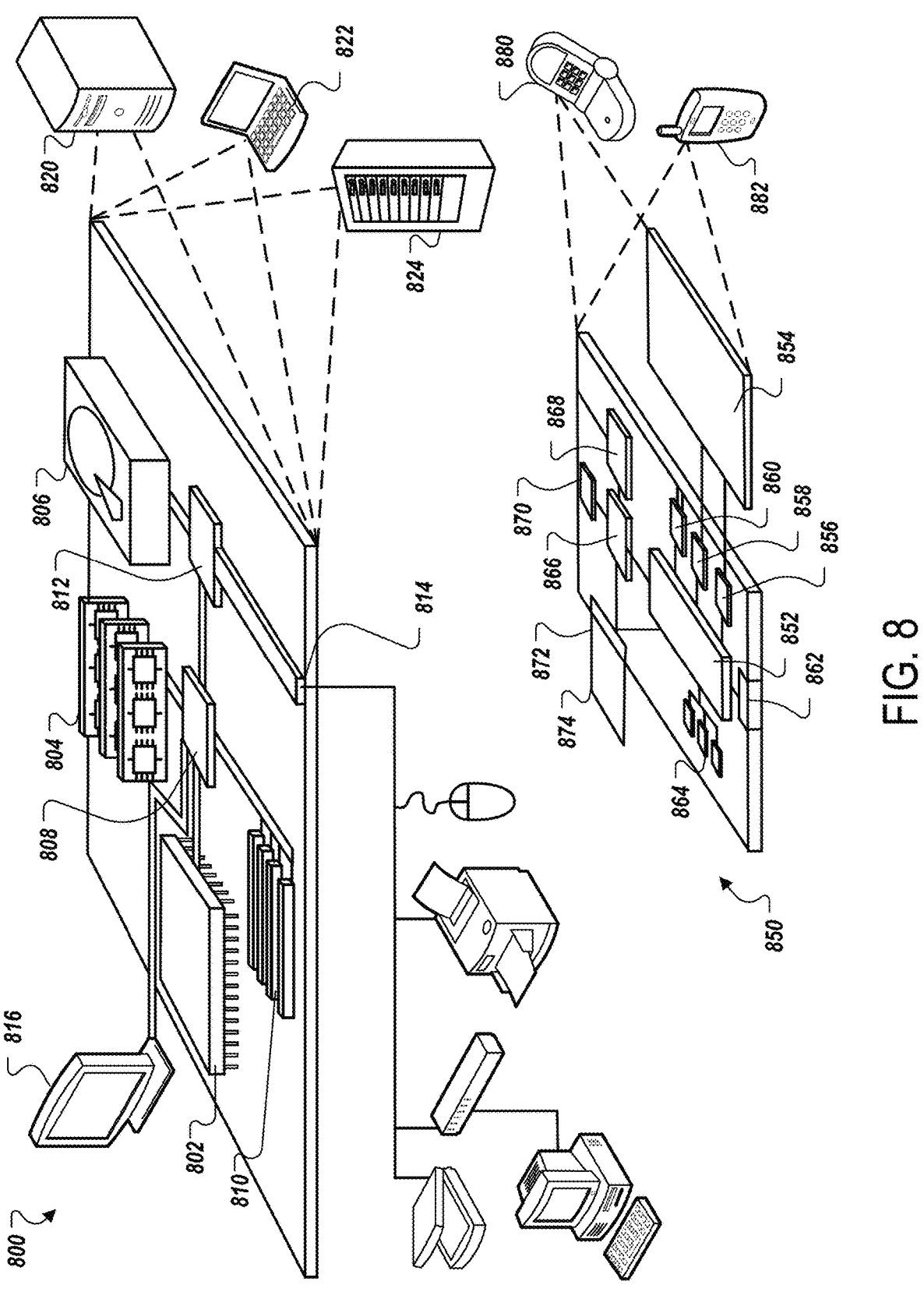
FIG. 8 is a diagram illustrating an example of a computing system used for processing radio signals using a machine-learning network.

FIG. 8 is a diagram illustrating an example of a computing system used for processing radio signals using a machine-learning network. The computing system includes computing device 800 and a mobile computing device 850 that can be used to implement the techniques described herein. For example, one or more components of the system 100 could be an example of the computing device 800 or the mobile computing device 850, such as a computer system implementing the control unit 101, devices that access information from the machine-learning network 112, or a server that accesses or stores information (e.g., model file 114) regarding the operations performed by the system 100. As another example, one or more components of the system 300 could be an example of the computing device 800 or the mobile computing device 850, such as a computer system implementing the control unit 301, devices 316, 318 and/or 320, or a server that accesses or stores information (e.g., model file 314) regarding the operations performed by the system 300.

The computing device 800 is intended to represent various forms of digital computers, such as laptops, desktops, workstations, personal digital assistants, servers, blade servers, mainframes, and other appropriate computers. The mobile computing device 850 is intended to represent various forms of mobile devices, such as personal digital assistants, cellular telephones, smart-phones, mobile embedded radio systems, radio diagnostic computing devices, and other similar computing devices. The components shown here, their connections and relationships, and their functions, are meant to be examples only, and are not meant to be limiting.

The computing device 800 includes a processor 802, a memory 804, a storage device 806, a high-speed interface 808 connecting to the memory 804 and multiple high-speed expansion ports 810, and a low-speed interface 812 connecting to a low-speed expansion port 814 and the storage device 806. Each of the processor 802, the memory 804, the storage device 806, the high-speed interface 808, the high-speed expansion ports 810, and the low-speed interface 812, are interconnected using various busses, and may be mounted on a common motherboard or in other manners as appropriate. The processor 802 can process instructions for execution within the computing device 800, including instructions stored in the memory 804 or on the storage device 806 to display graphical information for a GUI on an external input/output device, such as a display 816 coupled to the high-speed interface 808. In other implementations, multiple processors and/or multiple buses may be used, as appropriate, along with multiple memories and types of memory. In addition, multiple computing devices may be connected, with each device providing portions of the operations (e.g., as a server bank, a group of blade servers, or a multi-processor system). In some implementations, the processor 802 is a single threaded processor. In some implementations, the processor 802 is a multi-threaded processor. In some implementations, the processor 802 is a quantum computer.

The memory 804 stores information within the computing device 800. In some implementations, the memory 804 is a volatile memory unit or units. In some implementations, the memory 804 is a non-volatile memory unit or units. The memory 804 may also be another form of computer-readable medium, such as a magnetic or optical disk.

The storage device 806 is capable of providing mass storage for the computing device 800. In some implementations, the storage device 806 may be or include a computer-readable medium, such as a floppy disk device, a hard disk device, an optical disk device, or a tape device, a flash memory or other similar solid-state memory device, or an array of devices, including devices in a storage area network or other configurations. Instructions can be stored in an information carrier. The instructions, when executed by one or more processing devices (for example, processor 802), perform one or more methods, such as those described above. The instructions can also be stored by one or more storage devices such as computer- or machine readable mediums (for example, the memory 804, the storage device 806, or memory on the processor 802). The high-speed interface 808 manages bandwidth-intensive operations for the computing device 800, while the low-speed interface 812 manages lower bandwidth-intensive operations. Such allocation of functions is an example only. In some implementations, the high speed interface 808 is coupled to the memory 804, the display 816 (e.g., through a graphics processor or accelerator), and to the high-speed expansion ports 810, which may accept various expansion cards (not shown). In the implementation, the low-speed interface 812 is coupled to the storage device 806 and the low-speed expansion port 814. The low-speed expansion port 814, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 800 may be implemented in a number of different forms, as shown in the figure. For example, it may be implemented as a standard server 820, or multiple times in a group of such servers. In addition, it may be implemented in a personal computer such as a laptop computer 822. It may also be implemented as part of a rack server system 824. Alternatively, components from the computing device 800 may be combined with other components in a mobile device, such as a mobile computing device 850. Each of such devices may include one or more of the computing device 800 and the mobile computing device 850, and an entire system may be made up of multiple computing devices communicating with each other.

The mobile computing device 850 includes a processor 852, a memory 864, an input/output device such as a display 854, a communication interface 866, and a transceiver 868, among other components. The mobile computing device 850 may also be provided with a storage device, such as a micro-drive or other device, to provide additional storage. Each of the processor 852, the memory 864, the display 854, the communication interface 866, and the transceiver 868, are interconnected using various buses, and several of the components may be mounted on a common motherboard or in other manners as appropriate.

The processor 852 can execute instructions within the mobile computing device 850, including instructions stored in the memory 864. The processor 852 may be implemented as a chipset of chips that include separate and multiple analog and digital processors. The processor 852 may provide, for example, for coordination of the other components of the mobile computing device 850, such as control of user interfaces, applications run by the mobile computing device 850, and wireless communication by the mobile computing device 850.

The processor 852 may communicate with a user through a control interface 858 and a display interface 856 coupled to the display 854. The display 854 may be, for example, a TFT (Thin-Film-Transistor Liquid Crystal Display) display or an OLED (Organic Light Emitting Diode) display, or other appropriate display technology. The display interface 856 may include appropriate circuitry for driving the display 854 to present graphical and other information to a user. The control interface 858 may receive commands from a user and convert them for submission to the processor 852. In addition, an external interface 862 may provide communication with the processor 852, so as to enable near area communication of the mobile computing device 850 with other devices. The external interface 862 may provide, for example, for wired communication in some implementations, or for wireless communication in other implementations, and multiple interfaces may also be used.

The memory 864 stores information within the mobile computing device 850. The memory 864 can be implemented as one or more of a computer-readable medium or media, a volatile memory unit or units, or a non-volatile memory unit or units. An expansion memory 874 may also be provided and connected to the mobile computing device 850 through an expansion interface 872, which may include, for example, a SIMM (Single In Line Memory Module) card interface. The expansion memory 874 may provide extra storage space for the mobile computing device 850, or may also store applications or other information for the mobile computing device 850. Specifically, the expansion memory 874 may include instructions to carry out or supplement the processes described above, and may include secure information also. Thus, for example, the expansion memory 874 may be provide as a security module for the mobile computing device 850, and may be programmed with instructions that permit secure use of the mobile computing device 850. In addition, secure applications may be provided via the SIMM cards, along with additional information, such as placing identifying information on the SIMM card in a non-hackable manner.

The memory may include, for example, flash memory and/or NVRAM memory (nonvolatile random access memory), as discussed below. In some implementations, instructions are stored in an information carrier such that the instructions, when executed by one or more processing devices (for example, processor 852), perform one or more methods, such as those described above. The instructions can also be stored by one or more storage devices, such as one or more computer- or machine-readable mediums (for example, the memory 864, the expansion memory 874, or memory on the processor 852). In some implementations, the instructions can be received in a propagated signal, for example, over the transceiver 868 or the external interface 862.

The mobile computing device 850 may communicate wirelessly through the communication interface 866, which may include digital signal processing circuitry in some cases. The communication interface 866 may provide for communications under various modes or protocols, such as GSM voice calls (Global System for Mobile communications), SMS (Short Message Service), EMS (Enhanced Messaging Service), or MMS messaging (Multimedia Messaging Service), CDMA (code division multiple access), TDMA (time division multiple access), PDC (Personal Digital Cellular), WCDMA (Wideband Code Division Multiple Access), CDMA2000, or GPRS (General Packet Radio Service), LTE, 5G/6G cellular, among others. Such communication may occur, for example, through the transceiver 868 using a radio frequency. In addition, short-range communication may occur, such as using a Bluetooth, Wi-Fi, or other such transceiver (not shown). In addition, a GPS (Global Positioning System) receiver module 870 may provide additional navigation- and location-related wireless data to the mobile computing device 850, which may be used as appropriate by applications running on the mobile computing device 850.

The mobile computing device 850 may also communicate audibly using an audio codec 860, which may receive spoken information from a user and convert it to usable digital information. The audio codec 860 may likewise generate audible sound for a user, such as through a speaker, e.g., in a handset of the mobile computing device 850. Such sound may include sound from voice telephone calls, may include recorded sound (e.g., voice messages, music files, among others) and may also include sound generated by applications operating on the mobile computing device 850.

The mobile computing device 850 may be implemented in a number of different forms, as shown in the figure. For example, it may be implemented as a cellular telephone 880. It may also be implemented as part of a smart-phone 882, personal digital assistant, or other similar mobile device.

A number of implementations have been described. Nevertheless, it will be understood that various modifications may be made without departing from the spirit and scope of the disclosure. For example, various forms of the flows shown above may be used, with steps re-ordered, added, or removed.

Embodiments of the invention and all of the functional operations described in this specification can be implemented in digital electronic circuitry, or in computer software, firmware, or hardware, including the structures disclosed in this specification and their structural equivalents, or in combinations of one or more of them. Embodiments of the invention can be implemented as one or more computer program products, e.g., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal that is generated to encode information for transmission to suitable receiver apparatus.

A computer program (also known as a program, software, software application, script, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a tablet computer, a mobile telephone, a personal digital assistant (PDA), a mobile audio player, a Global Positioning System (GPS) receiver, to name just a few. Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the invention can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Embodiments of the invention can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the invention, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination.

Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Particular embodiments of the invention have been described. Other embodiments are within the scope of the following claims. For example, the steps recited in the claims can be performed in a different order and still achieve desirable results.

What is claimed is:

1. A method comprising:
   obtaining, by one or more computers, one or more radio frequency (RF) snapshots, wherein the RF snapshots include a set of signals from an RF source of a first RF source type;
   determining, using the RF snapshots, that a signal of the set of signals is of a first type;
   generating, by the one or more computers, a first training data set based on (i) the one or more RF snapshots and (ii) the determined first signal type of the set of signals;
   annotating, by the one or more computers, the first training data set to generate an annotated first training data set, wherein annotations of the first training data set indicate a particular signal type of RF signals emitted by the first RF source type that is configured to generate RF signals of the first signal type;
   generating, by the one or more computers, a detection and classification model trained to detect the particular signal type of RF signals based on the annotated first training data set; and
   providing, by the one or more computers, the trained detection and classification model to a sensor engine to detect and classify one or more new signals from an RF source of the first RF source type using the trained detection and classification model.

2. The method of claim 1, wherein the first RF source type includes an unmanned aerial system (UAS).

3. The method of claim 1, wherein obtaining, by the one or more computers, the one or more RF snapshots comprises enabling manual or fixed channel configuration on an RF source of the first RF source type.

4. The method of claim 1, wherein the set of signals comprise one or more signals based on an Ocusync protocol, variants of a Wi-Fi protocol, or a Frequency Shift Keying (FSK) emitter.

5. The method of claim 1, further comprising:
   controlling, through one or more graphical user interfaces that display an indication of the determined first signal type and that correspond to the one or more computers, one or more of: generating the first training data set, generating the annotated first training data set, or generating the trained detection and classification model.

6. The method of claim 5, wherein a graphical user interface of the one or more graphical user interfaces provides a visualization of a performance metric corresponding to generating the trained detection and classification model based on the annotated first training data set.

7. The method of claim 6, wherein the performance metric comprises a loss curve.

8. The method of claim 1, wherein annotating, by the one or more computers, the first training data set to generate the annotated first training data set is performed automatically by an auto-annotation process.

9. The method of claim 1, further comprising verifying that the trained detection and classification model is operating correctly using one or more verification graphical user interfaces corresponding to the one or more computers, wherein a verification graphical user interface of the one or more verification graphical user interface displays one or more graphical representations of signals with respective classifications generated by the trained detection and classification model.

10. The method of claim 1, wherein the one or more computers act as a front-end RF survey component within a system.

11. The method of claim 1, wherein the one or more new signals share one or more common RF characteristics with the set of signals.

12. The method of claim 1, wherein the first training data set comprises data corresponding to the set of signals and a predetermined training data set based on one or more RF sources of a second RF source type.

13. The method of claim 1, wherein the one or more computers are communicably connected to one or more RF antennas configured to detect the set of signals.

14. The method of claim 1, wherein detecting and classifying the one or more new signals using the trained detection and classification model comprises:

obtaining data of the one or more new signals in an environment using one or more RF antennas connected to the sensor engine;

providing the data of the one or more new signals as input to the trained detection and classification model; and obtaining an output indicating one or more of a signal classification of the one or more new signals, or a confidence value corresponding to the signal classification.

15. The method of claim 14, wherein the confidence value indicates a likelihood that the signal classification determined by the trained detection and classification model accurately classifies the one or more new signals.

16. A non-transitory computer-readable medium storing one or more instructions executable by a computer system to perform operations comprising:

obtaining one or more radio frequency (RF) snapshots, wherein the RF snapshots include a set of signals from an RF source of a first RF source type;

determining, using the RF snapshots, that a signal of the set of signals is of a first type;

generating a first training data set based on (i) the one or more RF snapshots and (ii) the determined first signal type of the set of signals;

annotating the first training data set to generate an annotated first training data set, wherein annotations of the first training data set indicate a particular signal type of RF signals emitted by the first RF source type that is configured to generate RF signals of the first signal type;

generating a detection and classification model trained to detect the particular signal type of RF signals based on the annotated first training data set; and providing the trained detection and classification model to a sensor engine to detect and classify one or more new signals from an RF source of the first RF source type using the trained detection and classification model.

17. The non-transitory computer-readable medium of claim 16, wherein the first RF source type includes an unmanned aerial system (UAS).

18. The non-transitory computer-readable medium of claim 16, wherein obtaining the one or more RF snapshots comprises enabling manual or fixed channel configuration on an RF source of the first RF source type.

19. The non-transitory computer-readable medium of claim 16, wherein annotating the first training data set to generate the annotated first training data set is performed automatically by an auto-annotation process.

20. A system, comprising:

one or more processors; and machine-readable media interoperably coupled with the one or more processors and storing one or more instructions that, when executed by the one or more processors, perform operations comprising:

obtaining one or more radio frequency (RF) snapshots, wherein the RF snapshots include a set of signals from an RF source of a first RF source type;

determining, using the RF snapshots, that a signal of the set of signals is of a first type;

generating a first training data set based on (i) the one or more RF snapshots and (ii) the determined first signal type of the set of signals;

annotating the first training data set to generate an annotated first training data set, wherein annotations of the first training data set indicate a particular signal type of RF signals emitted by the first RF source type that is configured to generate RF signals of the first signal type;

generating a detection and classification model trained to detect the particular signal type of RF signals based on the annotated first training data set; and providing the trained detection and classification model to a sensor engine to detect and classify one or more new signals from an RF source of the first RF source type using the trained detection and classification model.

\* \* \* \* \*